(12) United States Patent
Kambe et al.

(10) Patent No.: US 8,541,111 B2
(45) Date of Patent: Sep. 24, 2013

(54) ORGANIC ELECTROLUMINESCENT DEVICE AND DISPLAY APPARATUS

(75) Inventors: Emiko Kambe, Kanagawa (JP); Shigeyuki Matsunami, Kanagawa (JP); Yasunori Kijima, Tokyo (JP)

(73) Assignee: Sony Corporation, Tokyo (JP)

( * ) Notice: Subject to any disclaimer, the term of this patent is extended or adjusted under 35 U.S.C. 154(b) by 654 days.

(21) Appl. No.: 12/117,544

(22) Filed: May 8, 2008

(65) Prior Publication Data

US 2008/0292904 A1 Nov. 27, 2008

(30) Foreign Application Priority Data

May 21, 2007 (JP) ................................. 2007-133817

(51) Int. Cl.
*H01L 51/54* (2006.01)
(52) U.S. Cl.
USPC ............ 428/690; 428/917; 313/504; 313/506
(58) Field of Classification Search
None
See application file for complete search history.

(56) References Cited

U.S. PATENT DOCUMENTS

| | | | | |
|---|---|---|---|---|
| 2002/0055014 A1* | 5/2002 | Okada et al. | ................... | 428/690 |
| 2002/0096995 A1* | 7/2002 | Mishima et al. | ............... | 313/506 |
| 2003/0049489 A1* | 3/2003 | Hatwar et al. | ................ | 428/690 |
| 2004/0151944 A1* | 8/2004 | Onikubo et al. | ............... | 428/690 |
| 2005/0158577 A1* | 7/2005 | Ishibashi et al. | .............. | 428/690 |
| 2005/0208326 A1* | 9/2005 | Helber et al. | ................. | 428/690 |
| 2005/0225232 A1* | 10/2005 | Boroson et al. | ............... | 313/504 |
| 2005/0233166 A1* | 10/2005 | Ricks et al. | .................... | 428/690 |
| 2006/0019116 A1* | 1/2006 | Conley et al. | ................. | 428/690 |
| 2006/0172147 A1* | 8/2006 | Matsuura et al. | ............. | 428/690 |
| 2007/0200490 A1* | 8/2007 | Kawamura et al. | ........... | 313/504 |
| 2007/0222373 A1* | 9/2007 | Arakane et al. | ............... | 313/504 |
| 2008/0284322 A1* | 11/2008 | Hosokawa et al. | ........... | 313/504 |
| 2011/0198577 A1* | 8/2011 | Kambe et al. | ................... | 257/40 |

FOREIGN PATENT DOCUMENTS

| | | | |
|---|---|---|---|
| EP | 1341403 | * | 9/2003 |
| EP | 1734038 | * | 12/2006 |
| JP | 2000-026334 | | 1/2000 |
| JP | 2003-055652 | | 2/2003 |
| WO | 2007-052759 | | 5/2007 |
| WO | WO 2007/105448 | * | 9/2007 |

* cited by examiner

*Primary Examiner* — Dawn Garrett
(74) *Attorney, Agent, or Firm* — K&L Gates LLP

(57) ABSTRACT

A red light-emitting organic electroluminescent device is provided and includes an anode; a cathode; and an organic layer which includes a light-emitting layer and is interposed between the anode and cathode. The light-emitting layer includes a red light-emitting guest material and a host material composed of a polycyclic aromatic hydrocarbon compound whose mother skeleton has a ring member number of from four to seven. The organic electroluminescent device also includes an electron transport layer containing a benzimidazole derivative provided adjacent to the light-emitting layer.

13 Claims, 8 Drawing Sheets

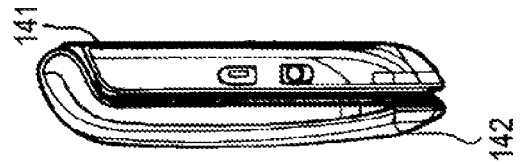
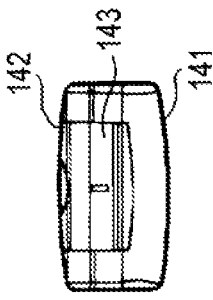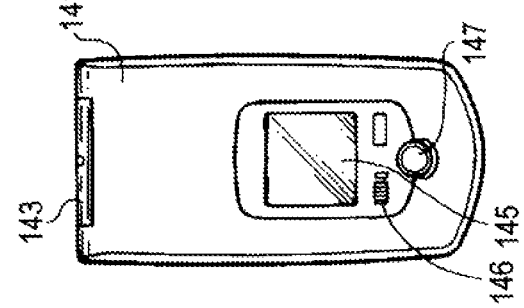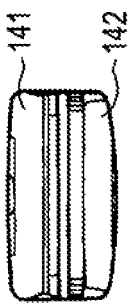
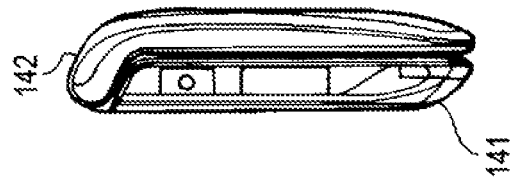
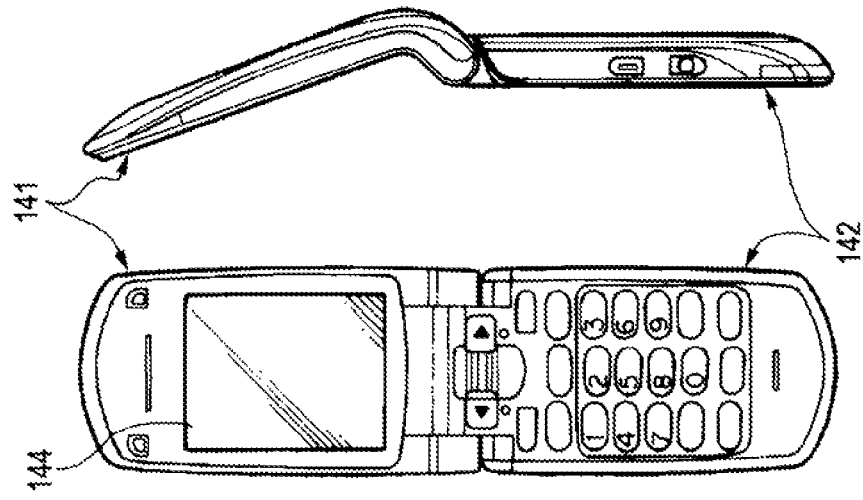

ORGANIC ELECTROLUMINESCENT DEVICE AND DISPLAY APPARATUS

CROSS REFERENCES TO RELATED APPLICATIONS

The present application claims priority to Japanese Patent Application JP 2007-133817 filed in the Japan Patent Office on May 21, 2007, the entire contents of which is being incorporated herein by reference.

BACKGROUND

The present application relates to an organic electroluminescent device and a display apparatus. In particular, the present application relates to a red light-emitting, organic electroluminescent device and a display apparatus using the same.

In recent years, a display apparatus using an organic electroluminescent device (so-called "organic EL device") is watched as a lightweight flat panel type display apparatus with high efficiency.

The organic electroluminescent device which configures such a display apparatus is provided on a transparent substrate composed of, for example, a glass and is prepared by stacking an anode composed of ITO (indium tin oxide: transparent electrode), an organic layer and a cathode in this order from the substrate side. The organic layer has a configuration in which a hole injection layer, a hole transport layer and an electron transporting light-emitting layer and further an electron transport layer or an electron injection layer are stacked in this order from the anode side. In the thus configured organic electroluminescent device, an electron injected from the cathode and a hole injected from the anode are recombined in the light-emitting layer, and light which is generated during this recombination is extracted from the substrate side via the anode.

In addition to an organic electroluminescent device having the foregoing configuration, the organic electroluminescent device also includes a so-called top emission type which is configured by stacking a cathode, an organic layer and an anode in this order from a substrate side and in which by further constituting an electrode positioned in an upper portion (an upper electrode as the cathode or anode) by a transparent material, light is extracted from the upper electrode side on an opposite side to the substrate. In particular, in a display apparatus of an active matrix type which is prepared by providing a thin film transistor (TFT) on a substrate, a so-called top emission structure in which an organic electroluminescent device of a top emission type is provided on the substrate having TFT formed thereon is advantageous in view of enhancing an aperture ratio of a light-emitting portion.

Now, in the case of taking into consideration practical implementation of an organic EL display, not only an enhancement of light extraction by widening the aperture of an organic electroluminescent device but an enhancement of luminous efficiency of the organic electroluminescent device is necessary. Then, various materials and layer configurations for the purpose of the luminous efficiency have been investigated.

For example, so far as a red light-emitting device is concerned, there has been proposed a configuration in which a naphthacene derivative (including rubrene derivatives) is used as a dopant material with respect to a new red light-emitting material in place of a pyran derivative represented by DCJTB which has hitherto been known. Also, a material having good electron transport properties such as Alq3 is used for an electron transport layer adjacent to a light-emitting layer containing such a red light-emitting material (see, for example, JP-A-2000-26334 and JP-A-2003-55652).

In the foregoing display apparatus, in order to perform full-color display, organic electroluminescent devices of respective colors which undergo emission of the three primary colors (red, green and blue) are aligned and used, or a white light-emitting organic electroluminescent device and color filters or color conversion layers of respective colors are combined and used. Of these, from the viewpoint of light extraction efficiency of light-emitting light, the configuration using organic electroluminescent devices which undergo emission of the respective colors is advantageous.

However, in the emission of the red light-emitting device using the foregoing naphthacene derivative (rubrene derivative), the current efficiency is about 6.7 cd/A, and the light-emitting color was concerned with orange emission rather than red emission.

Also, many red light-emitting layer hosts exhibit strong hole transport properties. For that reason, even in a configuration in which an electron transport layer configured by using an electron transporting material such as the foregoing Alq3 is provided adjacent to a light-emitting layer, a hole-electron recombination region easily exceeds the light-emitting layer and spreads into the electron transport layer. According to this, a lowering of the luminous efficiency in the light-emitting layer is generated. Also, in the case where emission is generated in the electron transport layer due to the hole-electron recombination, a color purity of the light-emitting light is lowered. Furthermore, in case of an electron transport material which is easily deteriorated by excitation, when the electron transport material is excited due to the hole-electron recombination in the electron transport layer, a lowering of a life characteristic is caused.

Then, it is desirable to provide a red light-emitting, organic electroluminescent device having high luminous efficiency and color purity and satisfactory life characteristic and a display apparatus using the same.

SUMMARY

An organic electroluminescent device according to an embodiment is a red light-emitting, organic electroluminescent device including an anode; a cathode and an organic layer which includes a light-emitting layer and is interposed between the anode and cathode. This light-emitting layer contains a red light-emitting guest material and a host material composed of a polycyclic aromatic hydrocarbon compound whose mother skeleton has a ring member number of from 4 to 7. Also, an electron transport layer containing a benzimidazole derivative represented by the following general formula (1) is provided adjacent to the light-emitting layer.

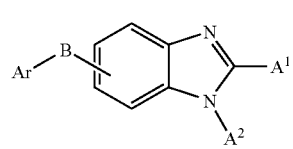

General Formula (1)

In the general formula (1), $A^1$ and $A^2$ each independently represents a hydrogen atom, a substituted or unsubstituted aryl group having not more than 60 carbon atoms, a substituted or unsubstituted heterocyclic group, a substituted or unsubstituted alkyl group having from 1 to 20 carbon atoms or an alkoxy group having from 1 to 20 carbon atoms.

In the general formula (1), B represents a substituted or unsubstituted arylene group having not more than 60 carbon atoms, a pyridinylene group which may have a substituted or unsubstituted group, a quinolinylene group which may have a substituent or a fluorenylene group which may have a substituent.

In the general formula (1), Ar represents a substituted or unsubstituted aryl group having from 6 to 60 carbon atoms, a substituted or unsubstituted heterocyclic group, a substituted or unsubstituted alkyl group having from 1 to 20 carbon atoms or a substituted or unsubstituted alkoxy group having from 1 to 20 carbon atoms.

In the organic electroluminescent device having such a configuration, since a carrier recombination region is concentrated in the light-emitting layer as compared with related-art devices using an electron transport material, as described in detail in the Examples as described later, the current efficiency increased, and the life characteristic was enhanced. Moreover, since the recombination region does not spread into other layers, it was noted that satisfactory high-purity red emission composed of only emission of the light-emitting layer is obtainable.

Also, according to an embodiment, a display apparatus having a plural number of organic electroluminescent devices having the foregoing configuration aligned and provided on a substrate is provided.

In such a display apparatus, as described previously, since the display apparatus using an organic electroluminescent device with high brightness and color purity as a red light-emitting device is configured, it is possible to realize full-color display with high color reproducibility by combining it with other green light-emitting device and blue light-emitting device.

In accordance with the organic electroluminescent device according to an embodiment as described previously, it is possible to attain an enhancement of the luminous efficiency of red light-emitting light while keeping color purity and to attain an enhancement of the life characteristic.

Also, in accordance with the display apparatus according to an embodiment, it is possible to realize full-color display with high color reproducibility by configuring a pixel through a set of a green light-emitting device and a blue light-emitting device together with an organic electroluminescent device which becomes a red light-emitting device with high color purity and luminous efficiency as described previously.

Additional features and advantages are described herein, and will be apparent from the following Detailed Description and the figures.

BRIEF DESCRIPTION OF THE FIGURES

FIGS. 6A and 6B are views showing a digital camera to which an embodiment is applied, in which FIG. 6A is a perspective view seen from the front side; and FIG. 6B is a perspective view seen from the rear side.

FIGS. 9A to 9G are views showing a portable terminal unit, for example, a portable handset, to which an embodiment is applied, wherein FIG. 9A is a front view in an opened state; FIG. 9B is a side view thereof; FIG. 9C is a front view in a closed state; FIG. 9D is a left side view; FIG. 9E is a right side view; FIG. 9F is a top view; and FIG. 9G is a bottom view.

DETAILED DESCRIPTION

Embodiments are hereunder described in detail with reference to the accompanying drawings with respect to an organic electroluminescent device and a display apparatus using the same by turns.

<<Organic Electroluminescent Device>>

Figure 1:
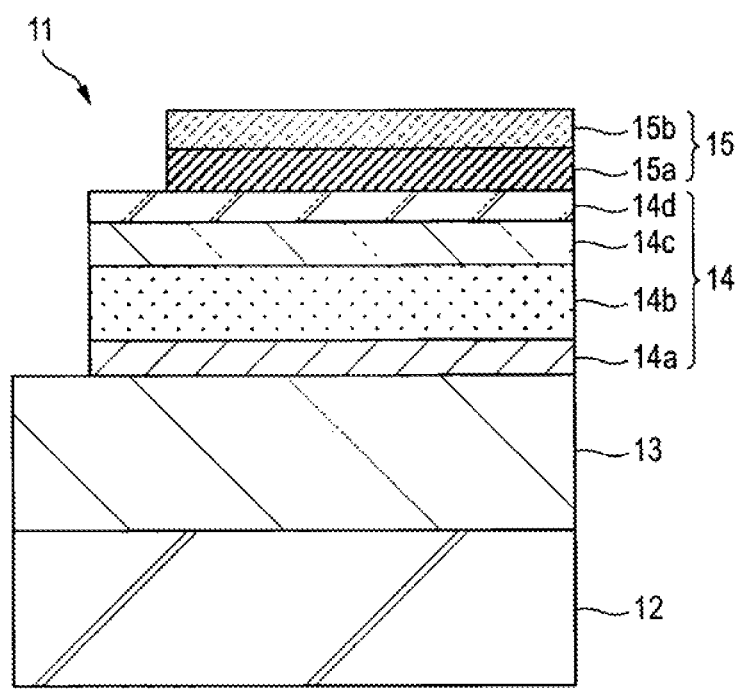
FIG. 1 is a cross-sectional view of an organic electroluminescent device according to an embodiment.

FIG. 1 is a cross-sectional view schematically showing an organic electroluminescent device according to an embodiment. An organic electroluminescent device 11 as illustrated in FIG. 1 is a stack of an anode 13, an organic layer 14 and a cathode 15 in this order on a substrate 12. Of these, the organic layer 14 is a stack of, for example, a hole injection layer 14a, a hole transport layer 14b, a light-emitting layer 14c and an electron transport layer 14d in this order from the side of the anode 13.

In an embodiment according, characteristic features reside in a configuration of the light-emitting layer 14c and a configuration of the electron transport layer 14d provided in contact therewith. On the assumption that the organic electroluminescent device 11 having such a stack configuration is configured as a device of a top emission type for extracting light from an opposite side to the substrate 12, details of each of the layers in this case are hereunder described in turn from the side of the substrate 12.

<Substrate>

The substrate 12 is a support in which the organic electroluminescent device 11 is aligned and formed on a side of the principal surface thereof. The substrate 12 may be made of a known material, and examples thereof include quartz, glass, metal foils and resin-made films or sheets. Of these, quartz and glass are preferable. In the case of a resin-made material, examples of the quality of the material include methacrylic resins represented by polymethyl methacrylate (PMMA); polyesters, for example, polyethylene terephthalate (PET), polyethylene naphthalate (PEN) and polybutylene naphthalate (PBN); and polycarbonate resins. It is important to employ a stack structure or surface treatment for controlling water permeability or gas permeability.

So far as a structure of a top emission type for extracting light from an opposite side to the substrate 12 is concerned, the substrate 12 per se is not required to have light transmittance, and for example, a substrate composed of mono-crystalline silicon may be used. Furthermore, in the case where a display apparatus configured by using this organic electroluminescent device 11 is of an active drive type, a substrate having an active device for driving the organic electroluminescent device 11 incorporated thereinto is used.

<Anode>

In order to efficiently inject a hole, an electrode material having a large work function from a vacuum level is used as the anode 13. Examples thereof include metals (for example, aluminum (Al), chromium (Cr), molybdenum (Mo), tungsten (W), copper (Cu), silver (Ag) and gold (Au)) and alloys thereof; oxides of such a metal or alloy; an alloy of tin oxide (SnO$_2$) and antimony (Sb); ITO (indium tin oxide); InZnO (indium zinc oxide); an alloy of zinc oxide (ZnO) and aluminum (Al); and oxides of such a metal or alloy. These materials are used singly or in a mixed state.

Also, the anode 13 may have a stack structure of a first layer with excellent light reflection properties having provided on an upper portion thereof a second layer having light transmittance and having a large work function.

Here, the first layer is composed mainly of an alloy containing aluminum as a main component. A sub-component thereof may be one containing at least one element having a relatively smaller work function than aluminum as the main component. Such a sub-component is preferably a lanthanoid series element. Though the work function of the lanthanoid series element is not large, when such an element is contained, not only the stability of the anode is enhanced, but hole injection properties of the anode are satisfied. In addition to the lanthanoid series element, an element, for example, silicon (Si) and copper (Cu) may be contained as the sub-component.

With respect to the content of the sub-component in the aluminum alloy layer which configures the first layer, for example, in the case of Nd, Ni, Ti, etc. for stabilizing aluminum, the content is preferably not more than about 10 wt % in total. Thus, it is possible to stably keep the aluminum alloy layer in a manufacturing process of an organic electroluminescent device while maintaining a refractive index of the aluminum alloy layer. Furthermore, it is possible to obtain working precision and chemical stability. Also, it is possible to improve the conductivity of the anode 13 and the adhesion to the substrate 12.

Also, as the second layer, there can be exemplified a layer composed of at least one member of an oxide of an aluminum alloy, an oxide of molybdenum, an oxygen of zirconium, an oxide of chromium and an oxide of tantalum. Here, for example, in the case where the second layer is a layer composed of an oxide of an aluminum alloy (inclusive of a spontaneously oxidized film) containing a lanthanide series element as a sub-component, because of a high transmittance of an oxide of the lanthanoid series element, the transmittance of the second layer containing this is good. For that reason, it is possible to maintain a high refractive index on the surface of the first layer. Furthermore, the second layer may be a transparent conductive layer of ITO (indium tin oxide), IZO (indium zinc oxide) or the like. Such a conductive layer is able to improve an electron injection characteristic of the anode 13.

Also, in the anode 13, a conductive layer may be provided on a side thereof coming into contact with the substrate 12 for the purpose of enhancing the adhesion between the anode 13 and the substrate 12. Examples of such a conductive layer include a transparent conductive layer of ITO, IZO or the like.

When the drive mode of a display apparatus which is configured by using this organic electroluminescent device 11 is an active matrix mode, the anode 13 is subjected to patterning for every pixel and provided in a state that it is connected to a driving thin film transistor provided on the substrate 12. In that case, configuration is made in such a manner that an insulating film (illustration of which is omitted) is provided on the anode 13 and that the surface of the anode 13 of each pixel is exposed from an aperture portion of this insulating film.

<Hole Injection Layer/Hole Transport Layer>

The hole injection layer 14a and the hole transport layer 14b are each provided for the purpose of enhancing the hole injection efficiency into the light-emitting layer 14c. Examples of a material of the hole injection layer 14a or the hole transport layer 14b which can be used include heterocyclic conjugated monomers, oligomers or polymers of, for example, polysilane based compounds, vinylcarbazole based compounds, thiophene based compounds and aniline based compounds as well as benzin, styrylamine, triphenylamine, porphyrin, triphenylene, azatriphenylene, tetracyanoquinodimethane, triazole, imidazole, oxadiazole, polyarylalkanes, phenylenediamine, arylamines, oxazole, anthracene, fluorenone, hydrazine, stilbene and derivatives thereof.

Also, more specific examples of the material of the hole injection layer 14a or the hole transport layer 14b include α-naphthylphenylphenylenediamine, porphyrin, metallic tetraphenylporphyrin, metallic naphthalocyanine, hexacyanoazatriphenylene, 7,7,8,8-tetracyanodimethane (TCNQ), 7,7,8,8-tetracyano-2,3,5,6-tetrafluoroquinodimethane (F4-TCNQ), tetracyano-4,4,4-tris(3-methylphenylphenylamino) triphenylamine, N,N,N',N'-tetrakis(p-tolyl)-p-phenylenediamine, N,N,N',N'-tetraphenyl-4,4'-diaminobiphenyl, N-phenylcarbazole, 4-di-p-tolylaminostilbene, poly(p-phenylenevinylene), poly(thiophenevinylene) and poly-(2,2'-thienylpyrrole). However, it should be appreciated that the embodiments are not limited thereto.

<Light-Emitting Layer>

The light-emitting layer 14c is a region where a hole injected from the side of the anode 13 and an electron injected from the side of the cathode 15 are recombined at the time of applying a voltage to the anode 13 and the cathode 15. In the present embodiment, the configuration of this light-emitting layer 14c is one of the characteristic features. Namely, the light-emitting layer 14c uses a polycyclic aromatic hydrocarbon compound whose mother skeleton has a ring member number of from 4 to 7 as a host material, and this host material is doped with a red light-emitting guest material, whereby red light-emitting light is generated.

Of these, the host material which constitutes the light-emitting layer 14c is a polycyclic aromatic hydrocarbon compound whose mother skeleton has a ring member number of from 4 to 7 and is selected among polycyclic aromatic hydrocarbon compounds having a pyrene, benzopyrene, chrysene, naphthacene, benzonaphthacene, dibenzonaphthacene, perylene or coronene skeleton.

Above all, it is preferred to use a naphthacene derivative represented by the following general formula (2) as the host material.

General Formula (2)

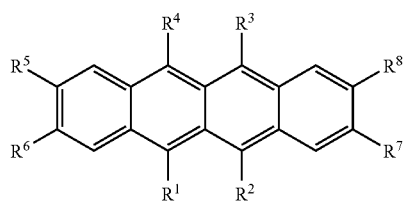

In the general formula (2), $R^1$ to $R^8$ each independently represents hydrogen, a halogen, a hydroxyl group, a substituted or unsubstituted carbonyl group having not more than 20 carbon atoms, a substituted or unsubstituted carbonyl ester group having not more than 20 carbon atoms, a substituted or unsubstituted alkyl group having not more than 20 carbon atoms, a substituted or unsubstituted alkenyl group having not more than 20 carbon atoms, a substituted or unsubstituted alkoxyl group having not more than 20 carbon atoms, a cyano group, a nitro group, a substituted or unsubstituted silyl group having not more than 30 carbon atoms, a substituted or unsubstituted aryl group having not more than 30 carbon atoms, a substituted or unsubstituted heterocyclic group having not more than 30 carbon atoms or a substituted or unsubstituted amino group having not more than 30 carbon atoms.

Examples of the aryl group represented by $R^1$ to $R^8$ in the general formula (2) include a phenyl group, a 1-naphthyl group, a 2-naphthyl group, a fluorenyl group, a 1-anthryl group, a 2-anthryl group, a 9-anthryl group, a 1-phenanthryl group, a 2-phenanthryl group, a 3-phenanthryl group, a 4-phenanthryl group, a 9-phenanthryl group, a 1-naphthacenyl group, a 2-naphthacenyl group, a 9-naphthacenyl group, a 1-pyrenyl group, a 2-pyrenyl group, a 4-pyrenyl group, a 1-chrysenyl group, a 6-chrysenyl group, a 2-fluoranthenyl group, a 3-fluoranthenyl group, a 2-biphenylyl group, a 3-biphenylyl group, a 4-biphenylyl group, an o-tolyl group, an m-tolyl group, a p-tolyl group and a p-t-butylphenyl group.

Also, examples of the heterocyclic group represented by $R^1$ to $R^8$ include 5-membered or 6-membered aromatic heterocyclic groups containing O, N or S as a hetero atom and fused polycyclic aromatic heterocyclic groups having from 2 to 20 carbon atoms. Examples of such aromatic heterocyclic groups and fused polycyclic aromatic heterocyclic groups include a thienyl group, a furyl group, a pyrrolyl group, a pyridyl group, a quinolyl group, a quinoxalyl group, an imidazopyridyl group and a benzothiazole group. Representative examples thereof include a 1-pyrrolyl group, a 2-pyrrolyl group, a 3-pyrrolyl group, a pyrazinyl group, a 2-pyridinyl group, a 3-pyridinyl group, a 4-pyridinyl group, a 1-indolyl group, a 2-indolyl group, a 3-indolyl group, a 4-indolyl group, a 5-indolyl group, a 6-indolyl group, a 7-indolyl group, a 1-isoindolyl group, a 2-isoindolyl group, a 3-isoindolyl group, a 4-isoindolyl group, a 5-isoindolyl group, a 6-isoindolyl group, a 7-isoindolyl group, a 2-furyl group, a 3-furyl group, a 2-benzofuranyl group, a 3-benzofuranyl group, a 4-benzofuranyl group, a 5-benzofuranyl group, a 6-benzofuranyl group, a 7-benzofuranyl group, a 1-isobenzofuranyl group, a 3-isobenzofuranyl group, a 4-isobenzofuranyl group, a 5-isobenzofuranyl group, a 6-isobenzofuranyl group, a 7-isobenzofuranyl group, a 1-quinolyl group, a 3-quinolyl group, a 4-quinolyl group, a 5-quinolyl group, a 6-quinolyl group, a 7-quinolyl group, an 8-quinolyl group, a 1-isoquinolyl group, a 3-isoquinolyl group, a 4-isoquinolyl group, a 5-isoquinolyl group, a 6-isoquinolyl group, a 7-isoquinolyl group, an 8-isoquinolyl group, a 2-quinoxalinyl group, a 5-quinoxalinyl group, a 6-quinoxalinyl group, a 1-carbazolyl group, a 2-carbazolyl group, a 3-carbazolyl group, a 4-carbazolyl group, a 9-carbazolyl group, a 1-phenanthrydinyl group, a 2-phenanthrydinyl group, a 3-phenanthrydinyl group, a 4-phenanthrydinyl group, a 6-phenanthrydinyl group, a 7-phenanthrydinyl group, an 8-phenanthrydinyl group, a 9-phenanthrydinyl group, a 10-phenanthrydinyl group, a 1-acridinyl group, a 2-acridinyl group, a 3-acridinyl group, a 4-acridinyl group and a 9-acridinyl group.

As the amino group represented by $R^1$ to $R^8$, all of an alkylamino group, an arylamino group and an aralkylamino group are useful. It is preferable that these amino groups have an aliphatic group having from 1 to 6 carbon atoms in total and/or a monocyclic to tetracyclic aromatic carbon ring. Examples of such an amino group include a dimethylamino group, a diethylamino group, a dibutylamino group, a diphenylamino group, a ditolylamino group, a bisbiphenylylamino group and a dinaphthylamino group.

Two or more kinds of the foregoing substituents may form a fused ring, and these substituents may further have a substituent.

The naphthacene derivative represented by the foregoing general formula (2) is especially preferably a rubrene derivative represented by the following general formula (2a).

General Formula (2a)

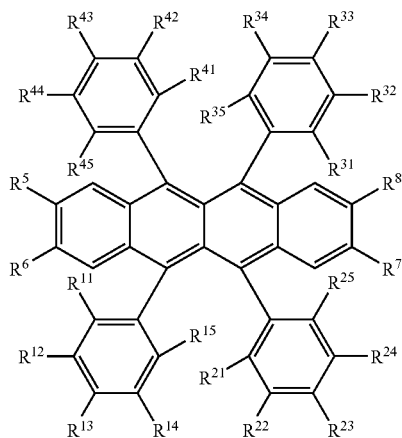

In the general formula (2a), $R^{11}$ to $R^{15}$, $R^{21}$ to $R^{25}$, $R^{31}$ to $R^{35}$ and $R^{41}$ to $R^{45}$ each independently represents a hydrogen atom, an aryl group, a heterocyclic group, an amino group, an aryloxy group, an alkyl group or an alkenyl group. However, it is preferable that $R^{11}$ to $R^{15}$, $R^{21}$ to $R^{25}$, $R^{31}$ to $R^{35}$ and $R^{41}$ to $R^{45}$ are the same, respectively.

Also, in the general formula (2a), $R^5$ to $R^8$ each independently represents a hydrogen atom, an optionally substituted aryl group or an optionally substituted alkyl group or alkenyl group.

In a preferred embodiment of the general formula (2a), the aryl group, the heterocyclic group and the amino group may be the same as those in $R^1$ to $R^8$ in the general formula (1). When $R^{11}$ to $R^{15}$, $R^{21}$ to $R^{25}$, $R^{31}$ to $R^{35}$ and $R^{41}$ to $R^{45}$ each represents an amino group, the amino group is an alkylamino group, an arylamino group or an aralkylamino group. It is preferable that these amino groups have an aliphatic group having from 1 to 6 carbon atoms in total or a monocyclic to tetracyclic aromatic carbon ring. Examples of such an amino group include a dimethylamino group, a diethylamino group, a dibutylamino group, a diphenylamino group, a ditolylamino group and a bisbiphenylylamino group.

As more specific other examples of the naphthacene derivative which is suitably used as the host material of the light-emitting layer 14c, there is exemplified rubrene of the following Compound (2)-1 which is one of the rubrene derivatives of the general formula (2a). Besides, the following Compounds (2)-2 to (2)-4 are exemplified.

Compound (2)-1

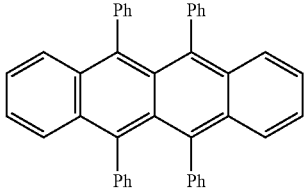

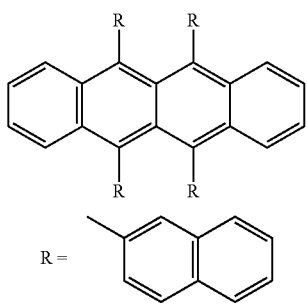

Compound (2)-2

Compound (2)-3

Compound (2)-4

Also, a perylene derivative of the general formula (3), a diketopyrrolopyrrole derivative of the general formula (4), a pyromethene derivative of the general formula (5), a pyran derivative of the general formula (6) or a styryl derivative of the general formula (7) as described below is used as the red light-emitting guest material which constitutes the light-emitting layer 14c. Details of the red light-emitting guest material are hereunder described.

—Perylene Derivative—

For example, a compound represented by the following general formula (3) (diindeno[1,2,3-cd]perylene derivative) is used as the red light-emitting guest material.

General Formula (3)

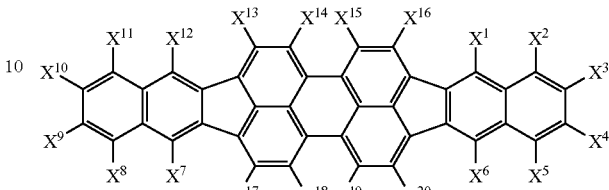

In the general formula (3), $X^1$ to $X^{20}$ each independently represents hydrogen, a halogen, a hydroxyl group, a substituted or unsubstituted carbonyl group having not more than 20 carbon atoms, a substituted or unsubstituted carbonyl ester group having not more than 20 carbon atoms, a substituted or unsubstituted alkyl group having not more than 20 carbon atoms, a substituted or unsubstituted alkenyl group having not more than 20 carbon atoms, a substituted or unsubstituted alkoxyl group having not more than 20 carbon atoms, a cyano group, a nitro group, a substituted or unsubstituted silyl group having not more than 30 carbon atoms, a substituted or unsubstituted aryl group having not more than 30 carbon atoms, a substituted or unsubstituted heterocyclic group having not more than 30 carbon atoms or a substituted or unsubstituted amino group having not more than 30 carbon atoms.

Examples of the aryl group represented by X1 to X20 in the general formula (3) include a phenyl group, a 1-naphthyl group, a 2-naphthyl group, a fluorenyl group, a 1-anthryl group, a 2-anthryl group, a 9-anthryl group, a 1-phenanthryl group, a 2-phenanthryl group, a 3-phenanthryl group, a 4-phenanthryl group, a 9-phenanthryl group, a 1-naphthacenyl group, a 2-naphthacenyl group, a 9-naphthacenyl group, a 1-pyrenyl group, a 2-pyrenyl group, a 4-pyrenyl group, a 1-chrysenyl group, a 6-chrysenyl group, a 2-fluoranthenyl group, a 3-fluoranthenyl group, a 2-biphenylyl group, a 3-biphenylyl group, a 4-biphenylyl group, an o-tolyl group, an m-tolyl group, a p-tolyl group and a p-t-butylphenyl group.

Also, examples of the heterocyclic group represented by $X^1$ to $X^{20}$ include 5-membered or 6-membered aromatic heterocyclic groups containing O, N or S as a hetero atom and fused polycyclic aromatic heterocyclic groups having from 2 to 20 carbon atoms. Examples of such aromatic heterocyclic groups and fused polycyclic aromatic heterocyclic groups include a thienyl group, a furyl group, a pyrrolyl group, a pyridyl group, a quinolyl group, a quinoxalyl group, an imidazopyridyl group and a benzothiazolyl group. Representative examples thereof include a 1-pyrrolyl group, a 2-pyrrolyl group, a 3-pyrrolyl group, a pyrazinyl group, a 2-pyridinyl group, a 3-pyridinyl group, a 4-pyridinyl group, a 1-indolyl group, a 2-indolyl group, a 3-indolyl group, a 4-indolyl group, a 5-indolyl group, a 6-indolyl group, a 7-indolyl group, a 1-isoindolyl group, a 2-isoindolyl group, a 3-isoindolyl group, a 4-isoindolyl group, a 5-isoindolyl group, a 6-isoindolyl group, a 7-isoindolyl group, a 2-furyl group, a 3-furyl group, a 2-benzofuranyl group, a 3-benzofuranyl group, a 4-benzofuranyl group, a 5-benzofuranyl group, a 6-benzofuranyl group, a 7-benzofuranyl group, a 1-isobenzofuranyl group, a 3-isobenzofuranyl group, a 4-isobenzofuranyl group, a 5-isobenzofuranyl group, a 6-isobenzofuranyl group, a 7-isobenzofuranyl group, a 1-quinolyl group, a 3-quinolyl group, a 4-quinolyl group, a 5-quinolyl group, a 6-quinolyl group, a 7-quinolyl group, an 8-quinolyl group, a 1-isoquinolyl group, a 3-isoquinolyl group, a 4-isoquinolyl group, a 5-isoquinolyl group, a 6-isoquinolyl group, a 7-isoquinolyl group, an 8-isoquinolyl group, a 2-quinoxalinyl group, a 5-quinoxalinyl group, a 6-quinoxalinyl group, a 1-carbazolyl group, a 2-carbazolyl group, a 3-carbazolyl group, a 4-carbazolyl group, a 9-carbazolyl group, a 1-phenanthrydinyl group, a 2-phenanthrydinyl group, a 3-phenanthrydinyl group, a 4-phenanthrydinyl group, a 6-phenanthrydinyl group, a 7-phenanthrydinyl group, an 8-phenanthrydinyl group, a 9-phenanthrydinyl group, a 10-phenanthrydinyl group, a 1-acridinyl group, a 2-acridinyl group, a 3-acridinyl group, a 4-acridinyl group and a 9-acridinyl group.

As the amino group represented by $X^1$ to $X^{20}$, all of an alkylamino group, an arylamino group and an aralkylamino group are useful. It is preferable that these amino groups have an aliphatic group having from 1 to 6 carbon atoms in total and/or a monocyclic to tetracyclic aromatic carbon ring. Examples of such an amino group include a dimethylamino group, a diethylamino group, a dibutylamino group, a diphenylamino group, a ditolylamino group, a bisbiphenylylamino group and a dinaphthylamino group.

Two or more kinds of the foregoing substituents may form a fused ring, and these substituents may further have a substituent.

Specific examples of the diindeno[1,2,3-cd]perylene derivative which is suitably used as the red light-emitting guest material in the light-emitting layer 14c include the following Compound (3)-1 to (3)-8. However, it should be appreciated that the embodiments are not limited thereto.

Compound (3)-1

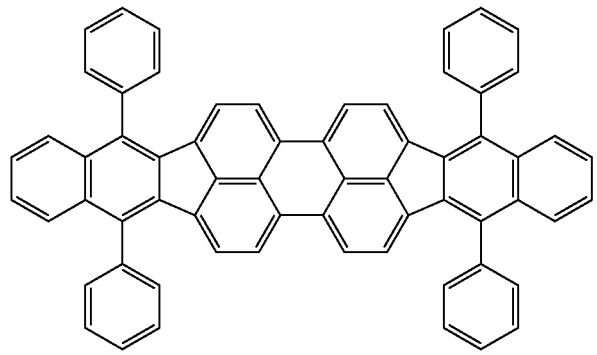

Compound (3)-2

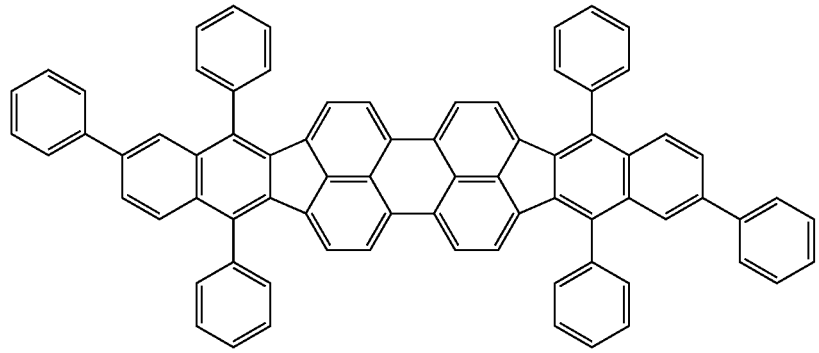

Compound (3)-3

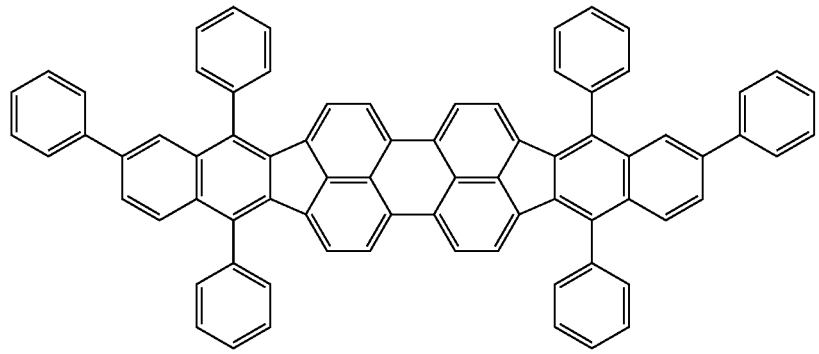

Compound (3)-4
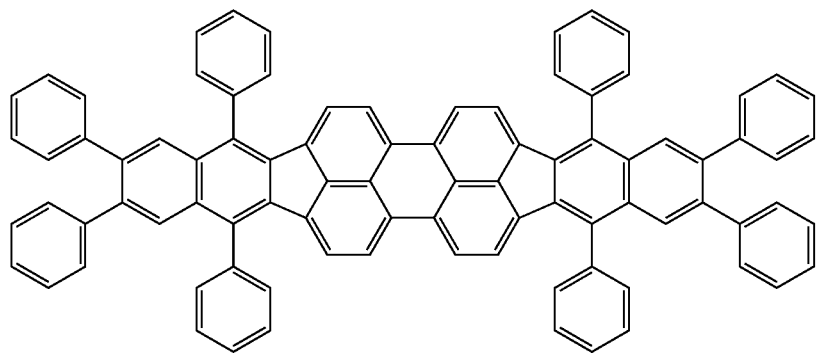
Compound (3)-5
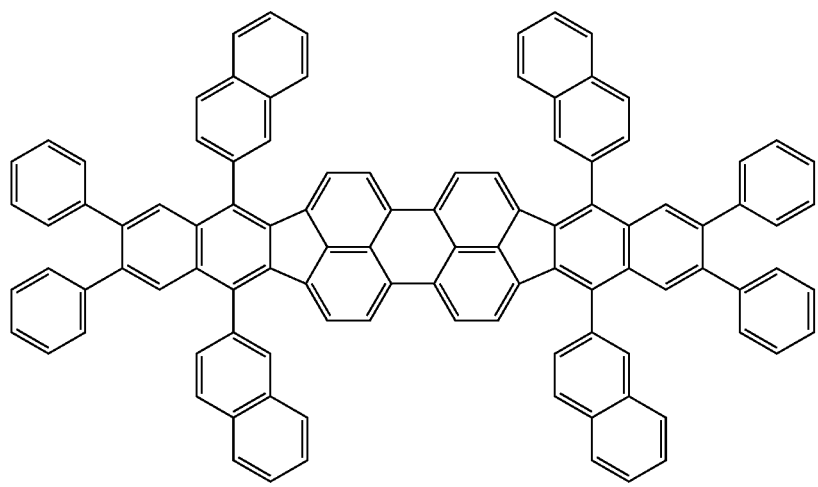
Compound (3)-6
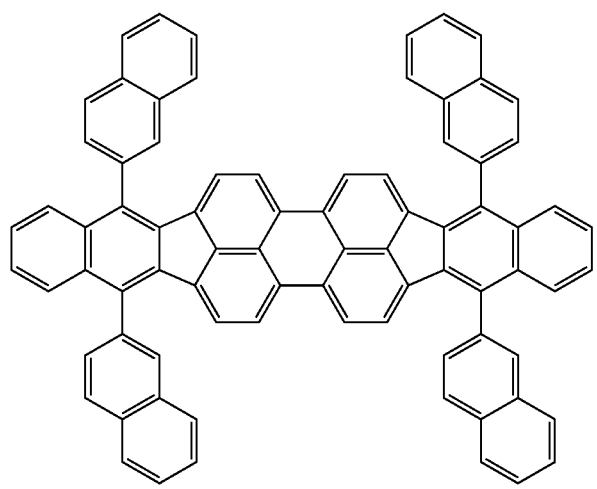

-continued

Compound (3)-7

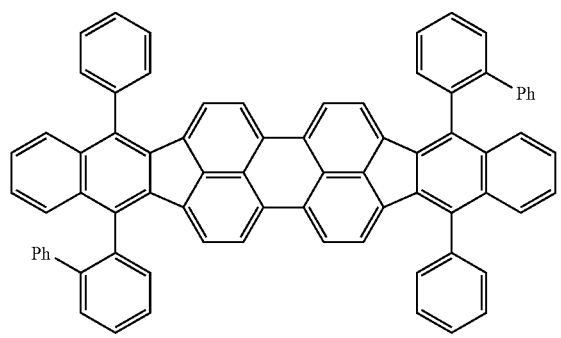

Compound (3)-8

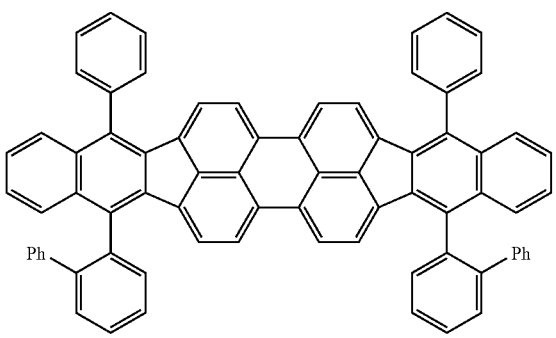

—Diketopyrrolopyrrole Derivative—

For example, a compound represented by the following general formula (4) (diketopyrrolopyrrole derivative) is used as the red light-emitting guest material.

General Formula (4)

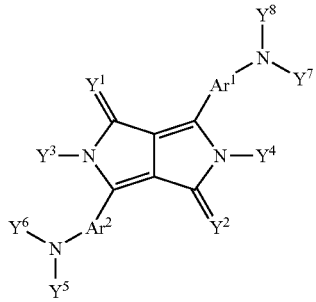

In the general formula (4), $Y^1$ and $Y^2$ each independently represents an oxygen atom or a substituted or unsubstituted imino group. Also, $Y^3$ to $Y^8$ each independently represents hydrogen, a halogen, a substituted or unsubstituted alkyl group having not more than 20 carbon atoms, a substituted or unsubstituted alkenyl group having not more than 20 carbon atoms, a substituted or unsubstituted aryl group having not more than 30 carbon atoms, a substituted or unsubstituted heterocyclic group having not more than 30 carbon atoms or a substituted or unsubstituted amino group having not more than 30 carbon atoms.

Also, in the general formula (4), $Ar^1$ and $Ar^2$ each represents a divalent group selected among a substituted or unsubstituted aromatic hydrocarbon group and a substituted or unsubstituted aromatic heterocyclic group.

In the general formula (4), the substituted or unsubstituted aryl group represented by $Y^3$ to $Y^8$, the heterocyclic group represented by $Y^3$ to $Y^8$ and the amino group represented by $Y^3$ to $Y^8$ are the same as those in the perylene derivative represented by the general formula (3). It is also the same that two or more kinds of the foregoing substituents may form a fused ring; and that these substituents may further have a substituent.

Specific examples of the diketopyrrolopyrrole derivative which is suitably used as the red light-emitting guest material in the light-emitting layer 14c include the following Compound (4)-1 to (4)-14. However, it should be appreciated that the embodiments are not limited thereto at all.

Compound (4)-1

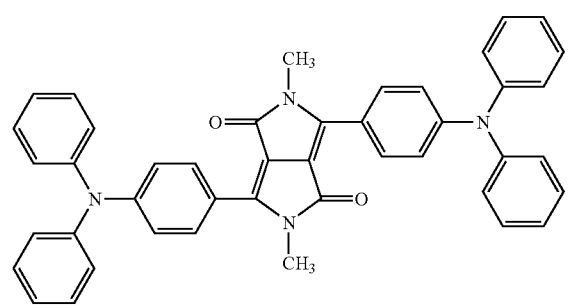

Compound (4)-2

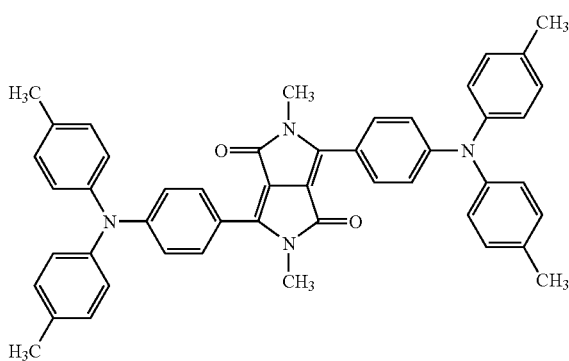

Compound (4)-3

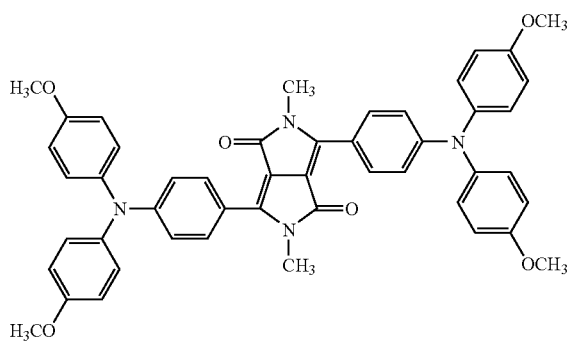

Compound (4)-4
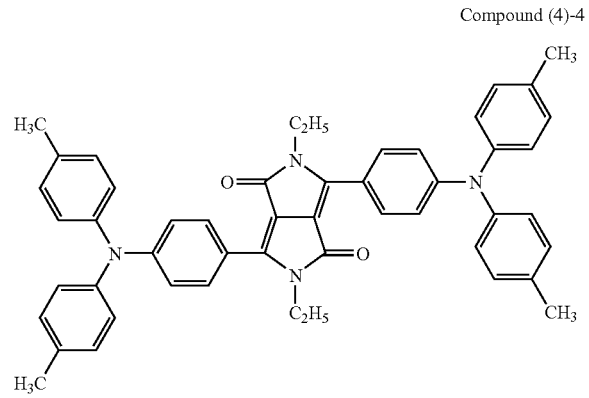
Compound (4)-5
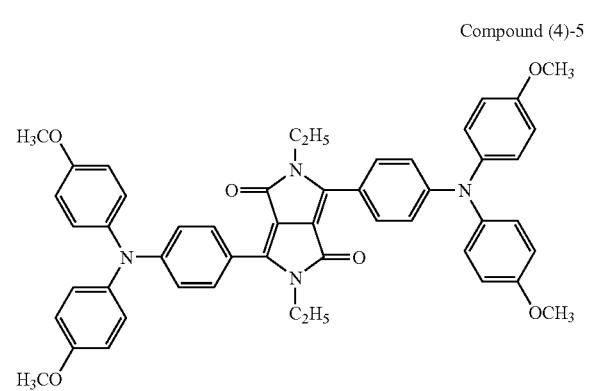
Compound (4)-6
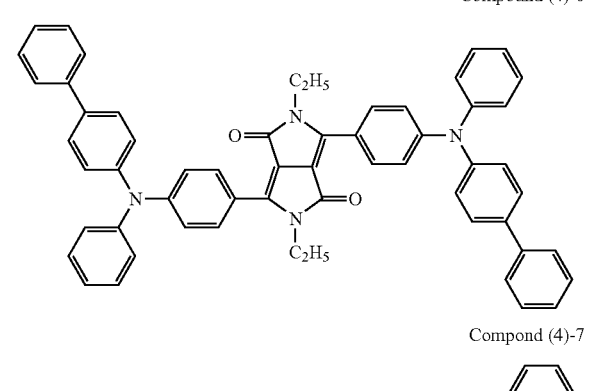
Compond (4)-7
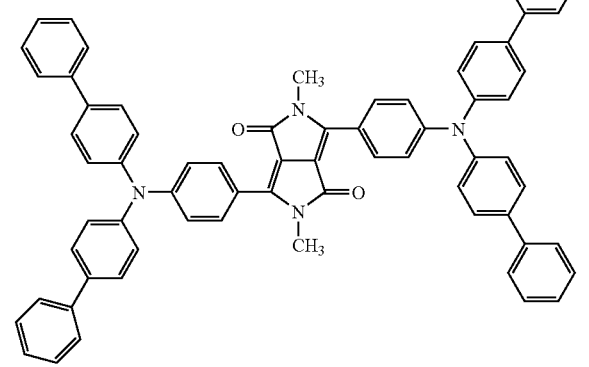
Compound (4)-8
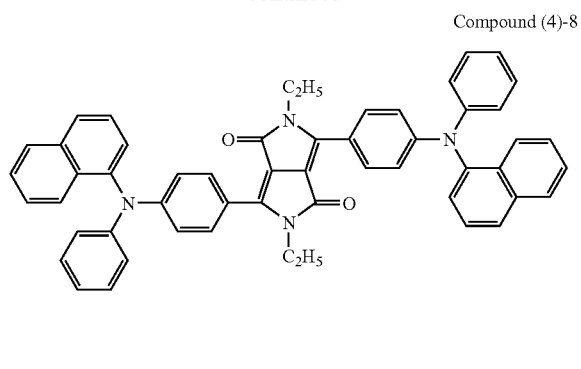
Compound (4)-9
Compound (4)-10
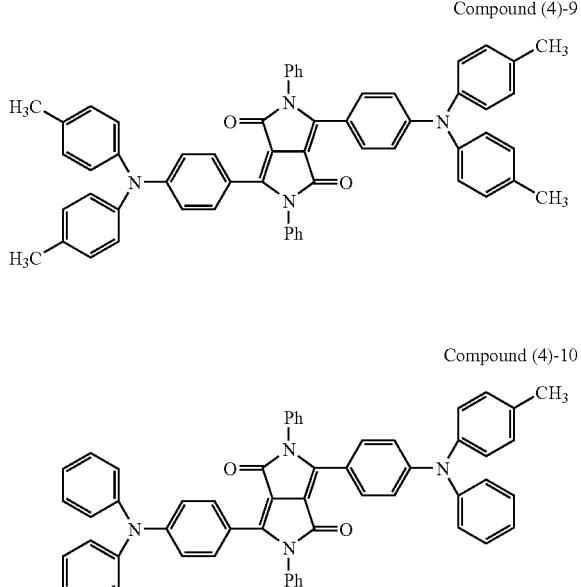
Compound (4)-11
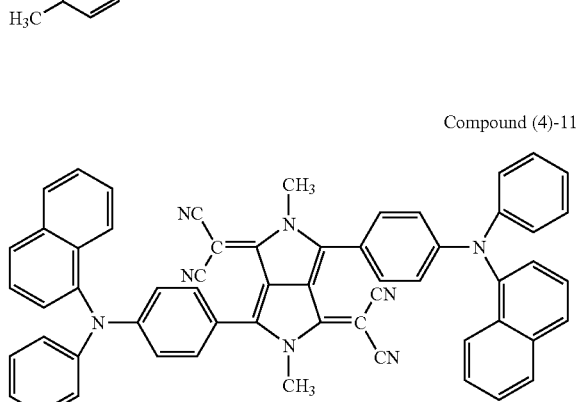
Compound (4)-12
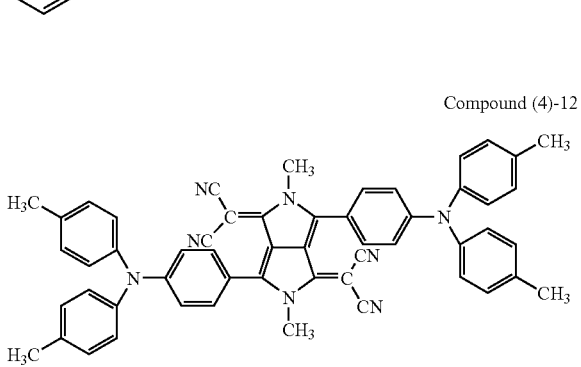

Compound (4)-13

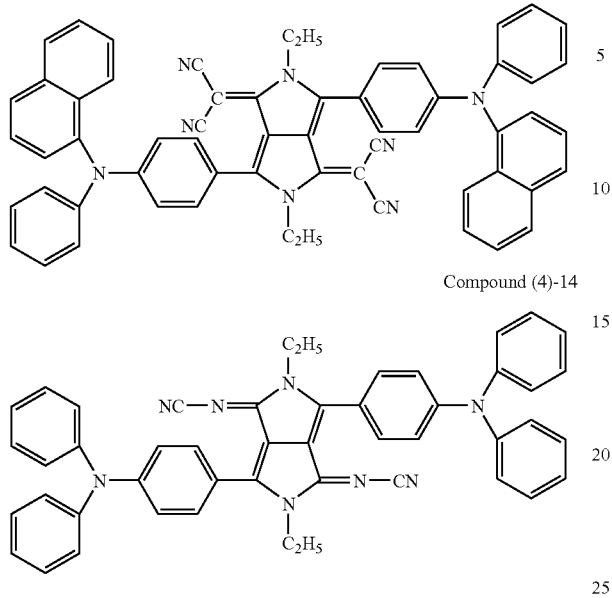

Compound (4)-14

Compound (5)-1

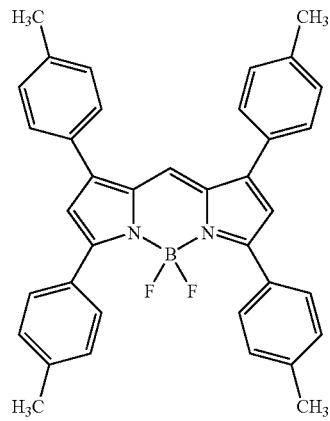

—Pyromethene Derivative—

For example, a compound represented by the following general formula (5) (pyromethene derivative) is used as the red light-emitting guest material.

General Formula (5)

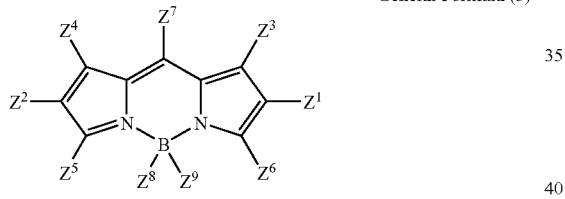

In the general formula (5), $Z^1$ to $Z^9$ each independently represents hydrogen, a halogen, a substituted or unsubstituted alkyl group having not more than 20 carbon atoms, a substituted or unsubstituted alkenyl group having not more than 20 carbon atoms, a substituted or unsubstituted alkoxyl group having not more than 20 carbon atoms, a cyano group, a nitro group, a substituted or unsubstituted silyl group having not more than 30 carbon atoms, a substituted or unsubstituted aryl group having not more than 30 carbon atoms, a substituted or unsubstituted heterocyclic group having not more than 30 carbon atoms or a substituted or unsubstituted amino group having not more than 30 carbon atoms.

In the general formula (5), the substituted or unsubstituted aryl group represented by $Z^1$ to $Z^9$, the heterocyclic group represented by $Z^1$ to $Z^9$ and the amino group represented by $Z^1$ to $Z^9$ are the same as those in the perylene derivative represented by the general formula (3). It is also the same that two or more kinds of the foregoing substituents may form a fused ring; and that these substituents may further have a substituent.

Specific examples of the pyromethene derivative which is suitably used as the red light-emitting guest material in the light-emitting layer 14c include the following Compound (5)-1 to (5)-68. However, it should be appreciated that the embodiments are is not limited thereto.

Compound (5)-2

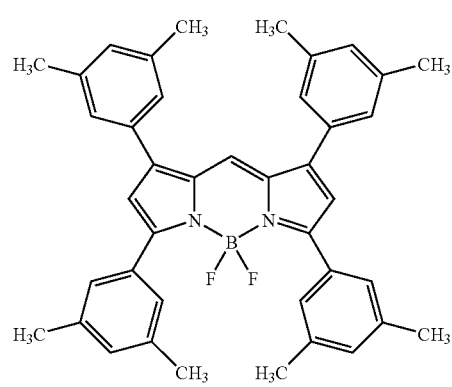

Compound (5)-3

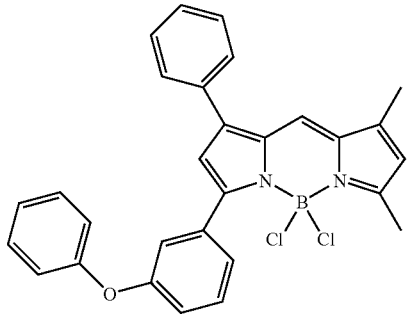

Compound (5)-4

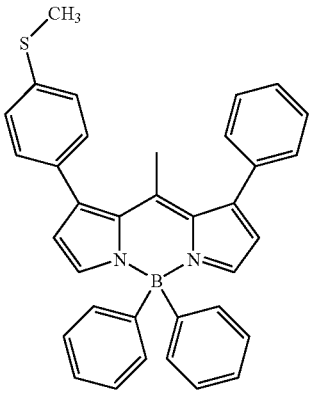

Compound (5)-5
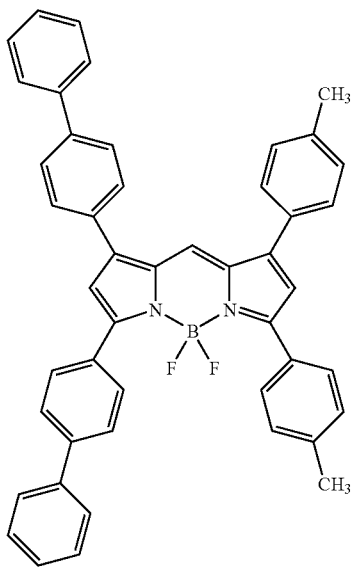
Compound (5)-6
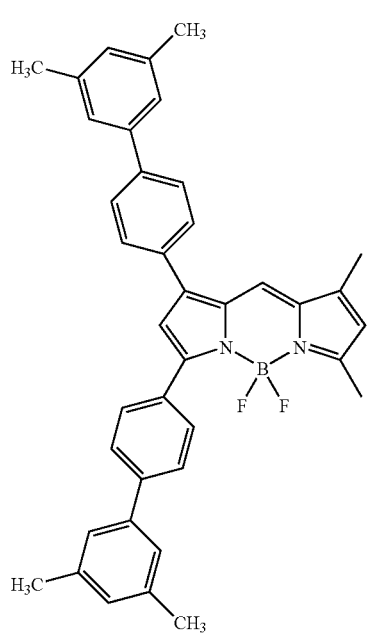
Compound (5)-7
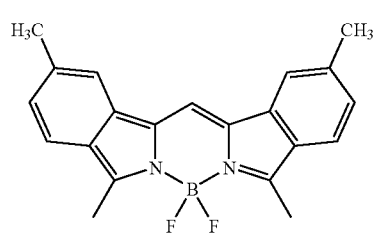
Compound (5)-8
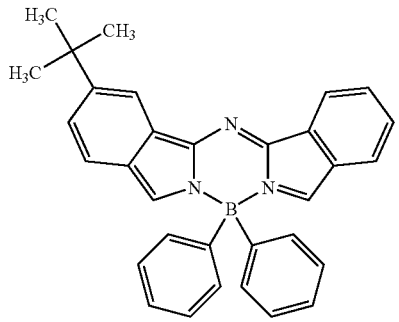
Compound (5)-9
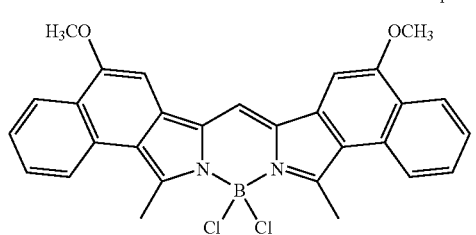
Compound (5)-10
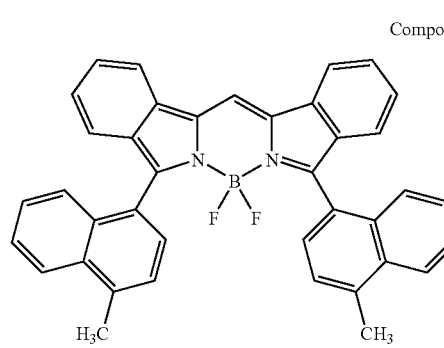
Compound (5)-11
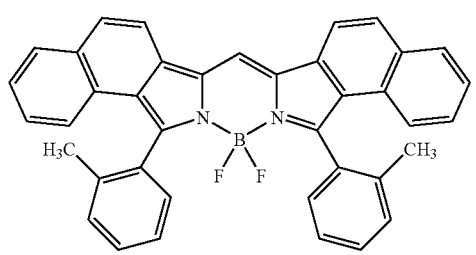
Compound (5)-12
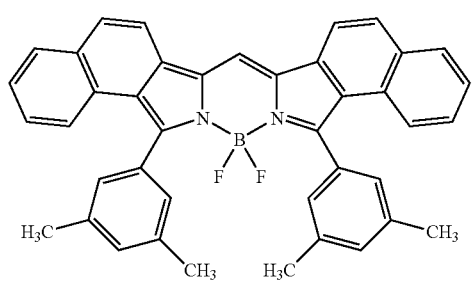

-continued
Compound (5)-13
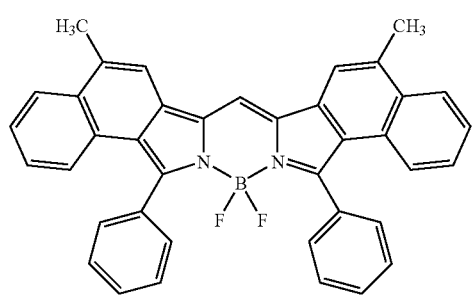
Compound (5)-14
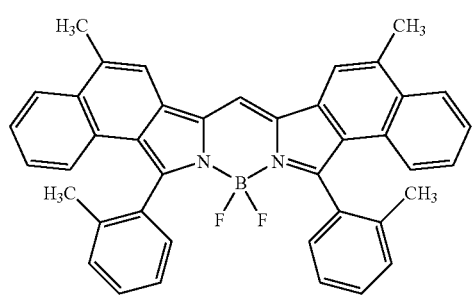
Compound (5)-15
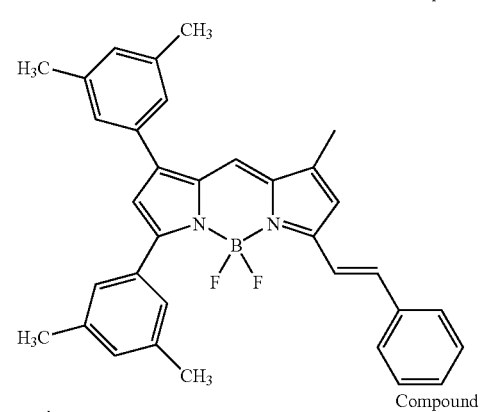
Compound (5)-16
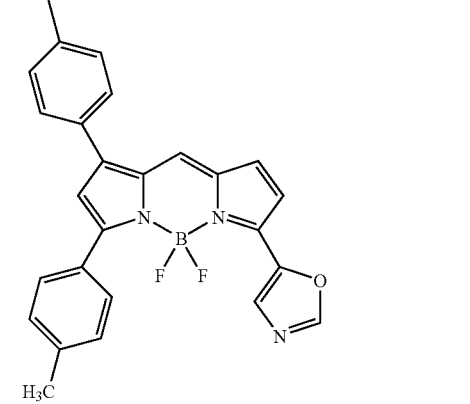
Compound (5)-17
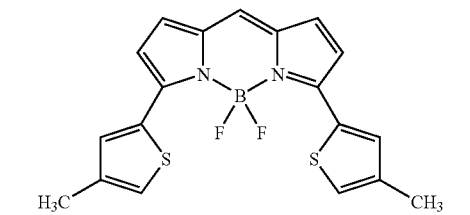
-continued
Compound (5)-18
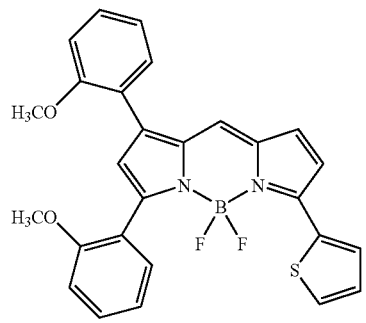
Compound (5)-19
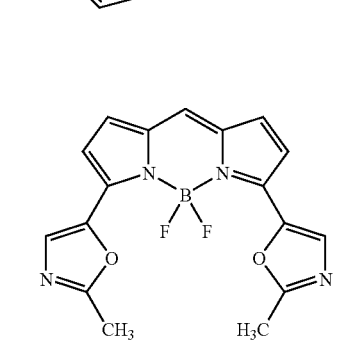
Compound (5)-20
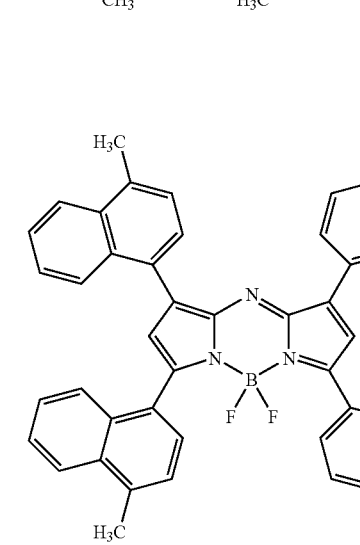
Compound (5)-21
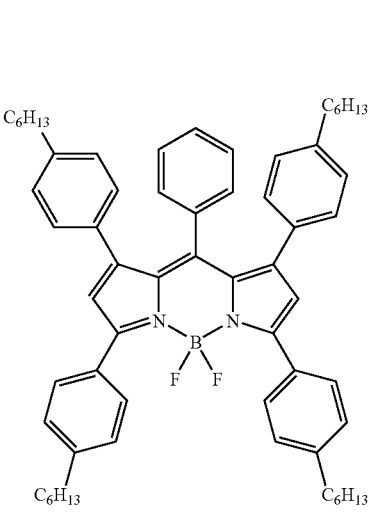

Compound (5)-22
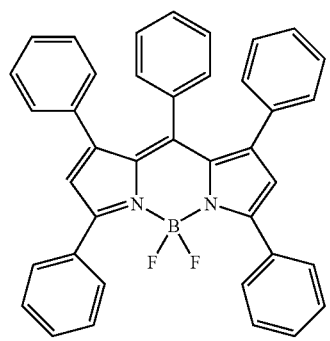
Compound (5)-23
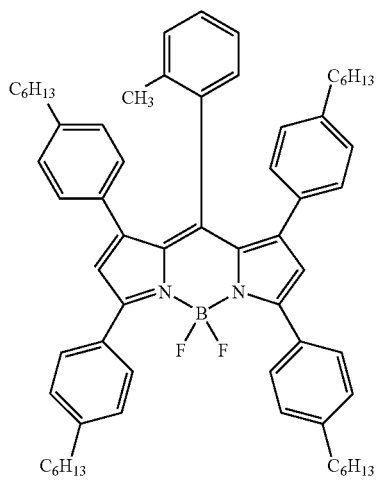
Compound (5)-24
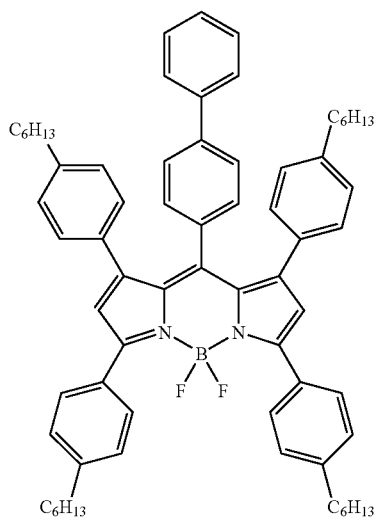
Compound (5)-25
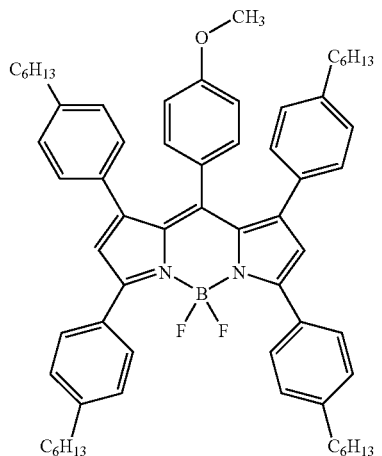
Compound (5)-26
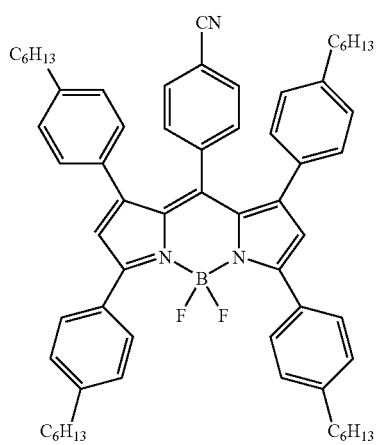
Compound (5)-27
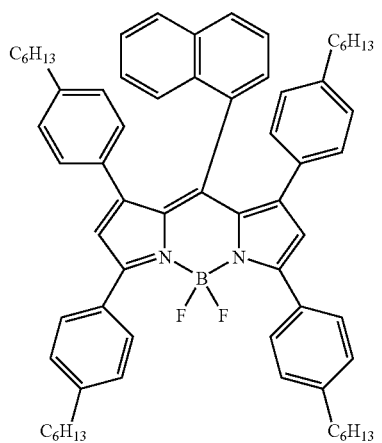

Compound (5)-28
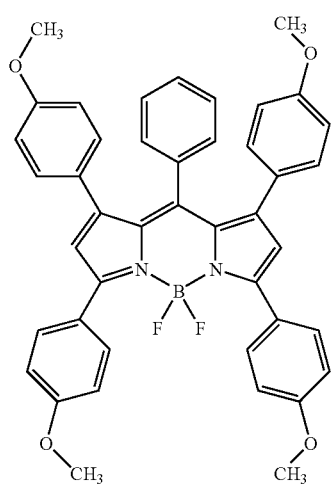
Compound (5)-29
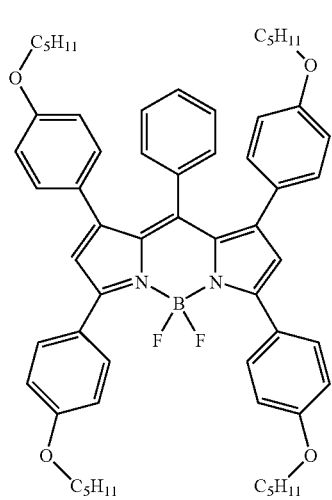
Compound (5)-30
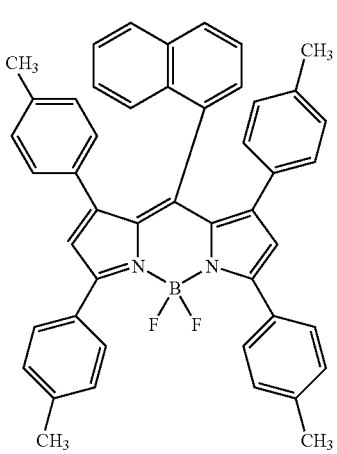
Compound (5)-31
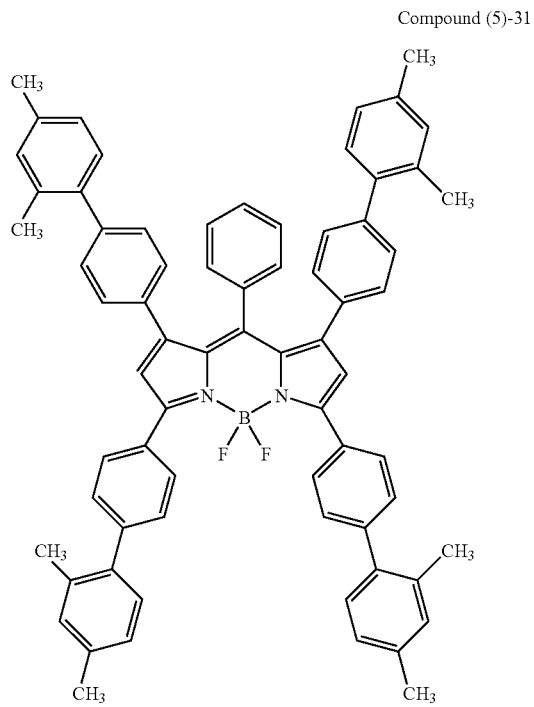
Compound (5)-32
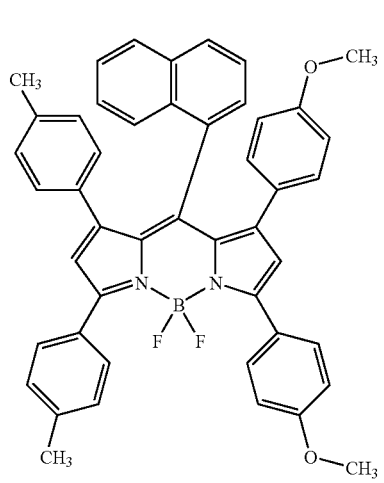
Compound (5)-33
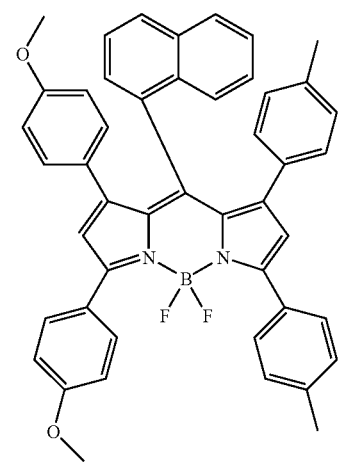

Compound (5)-34
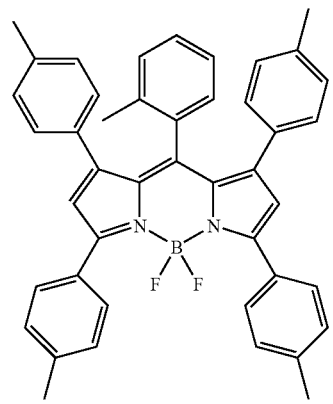
Compound (5)-35
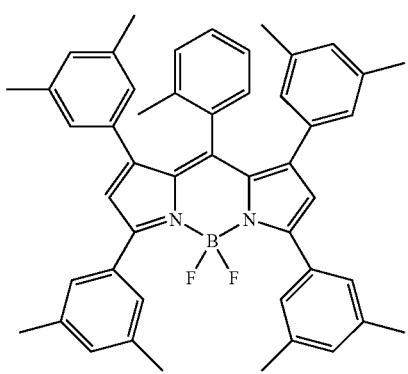
Compound (5)-36
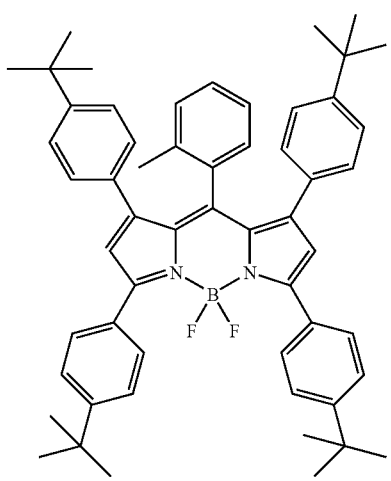
Compound (5)-37
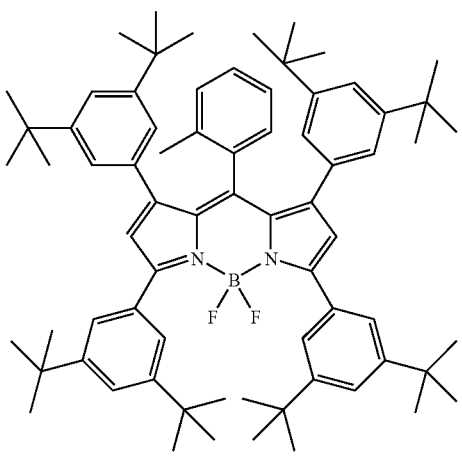
Compound (5)-38
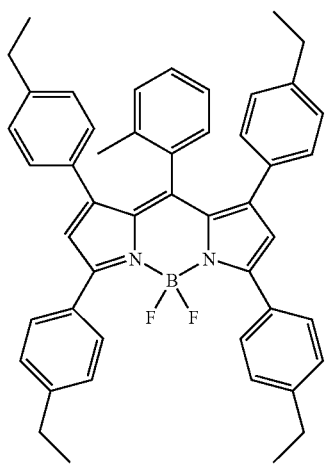
Compound (5)-39
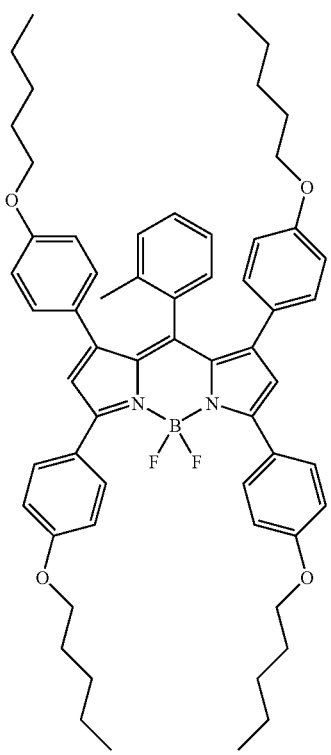

Compound (5)-40
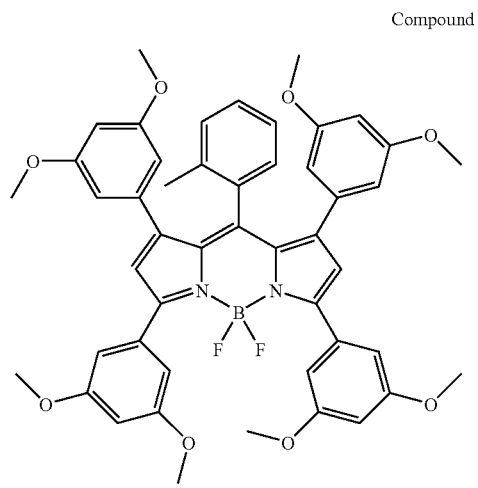
Compound (5)-41
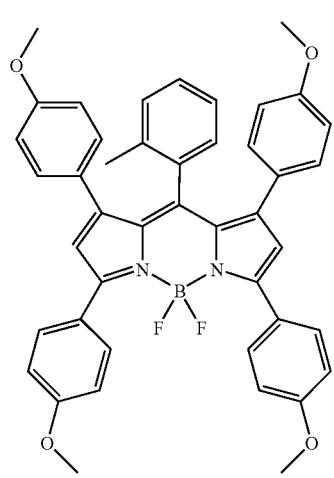
Compound (5)-42
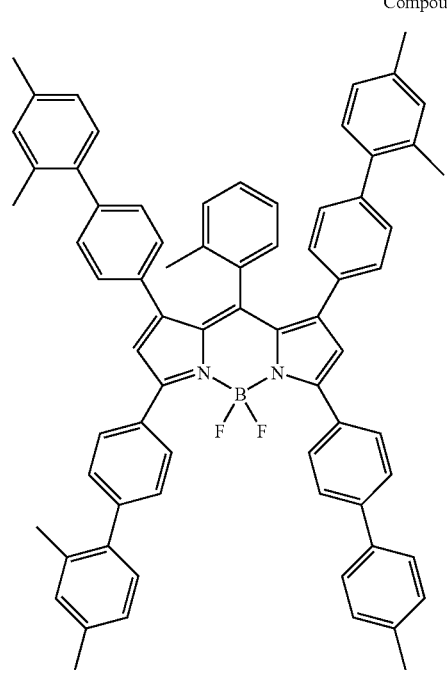
Compound (5)-43
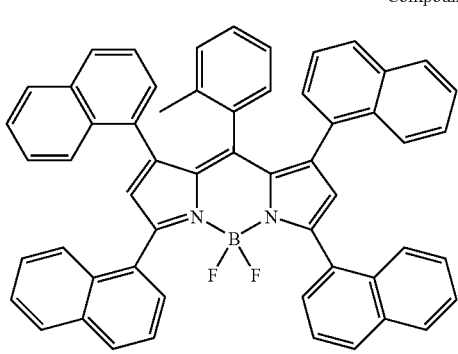
Compound (5)-44
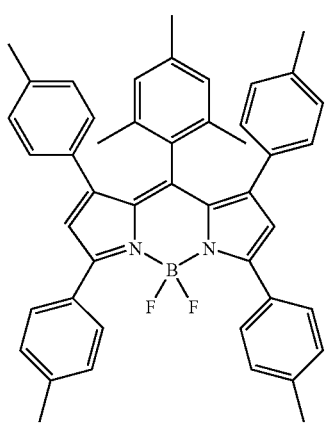
Compound (5)-45
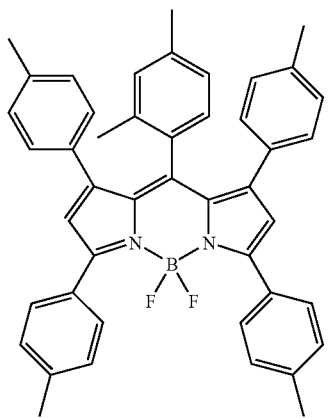
Compound (5)-46
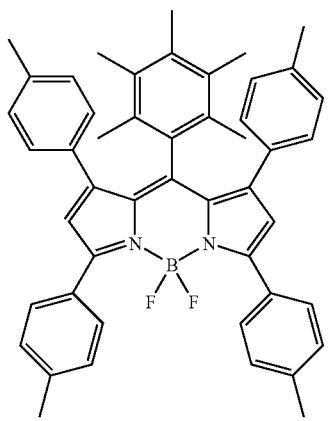

Compound (5)-47
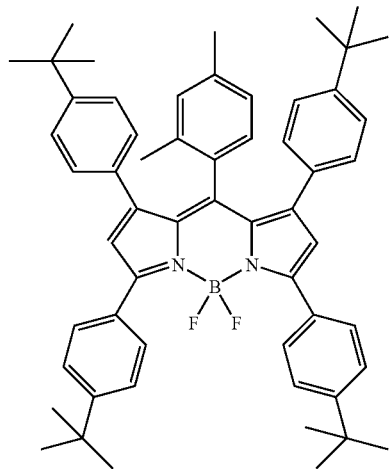
Compound (5)-48
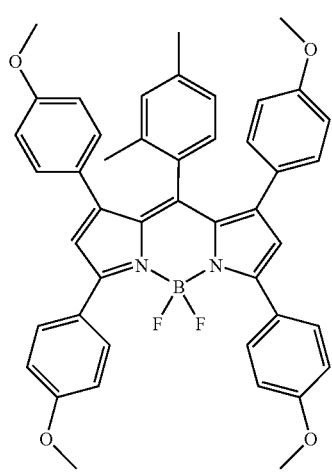
Compound (5)-49
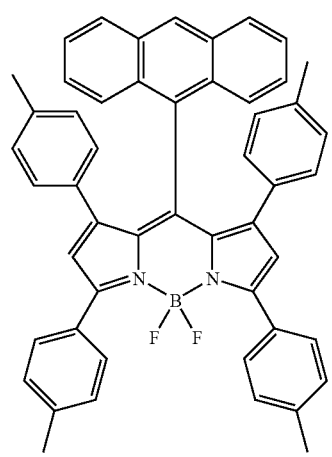
Compound (5)-50
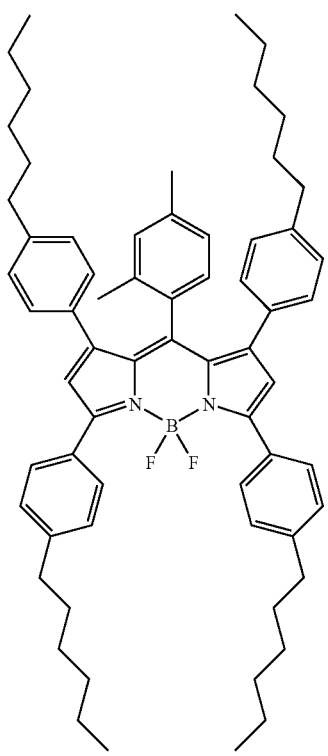
Compound (5)-51
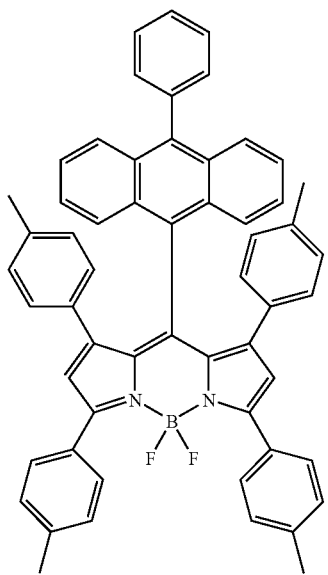

-continued
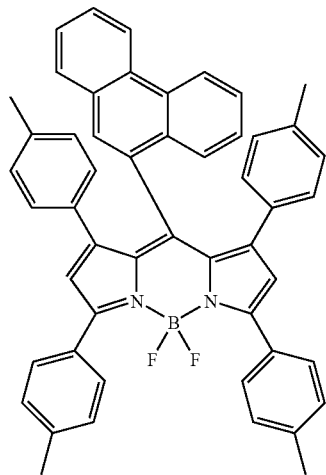
Compound (5)-52
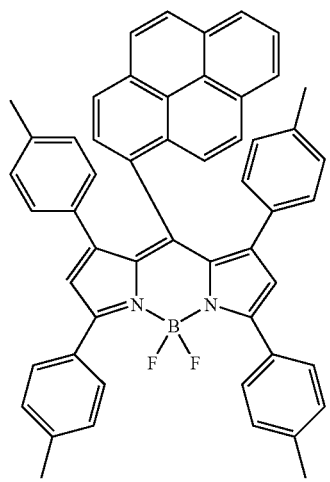
Compound (5)-53
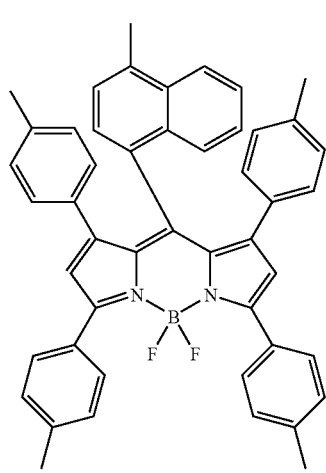
Compound (5)-54
-continued
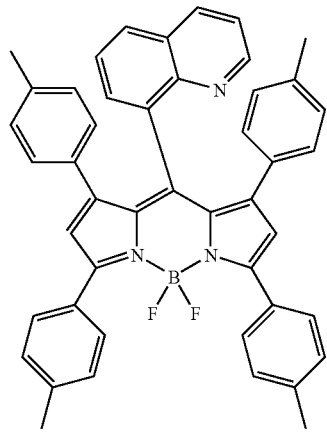
Compound (5)-55
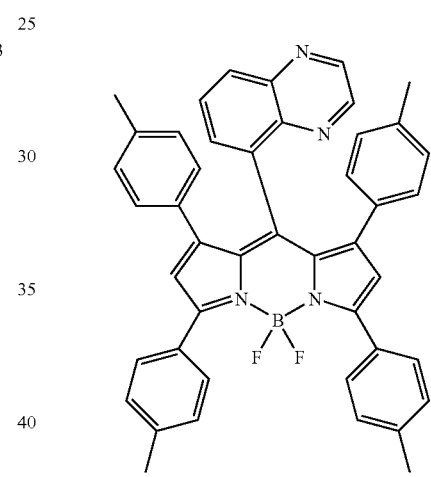
Compound (5)-56
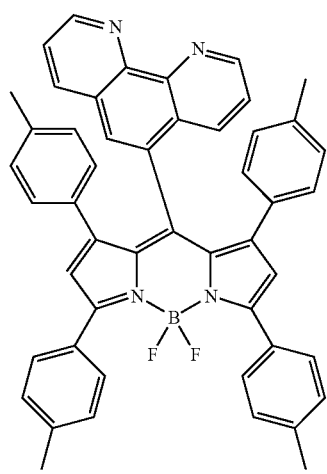
Compound (5)-57

Compound (5)-58
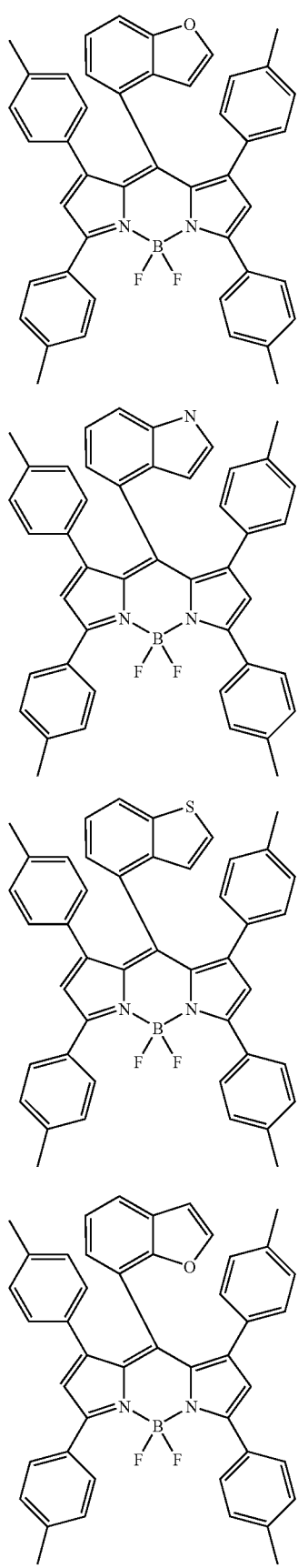
Compound (5)-59
Compound (5)-60
Compound (5)-61
Compound (5)-62
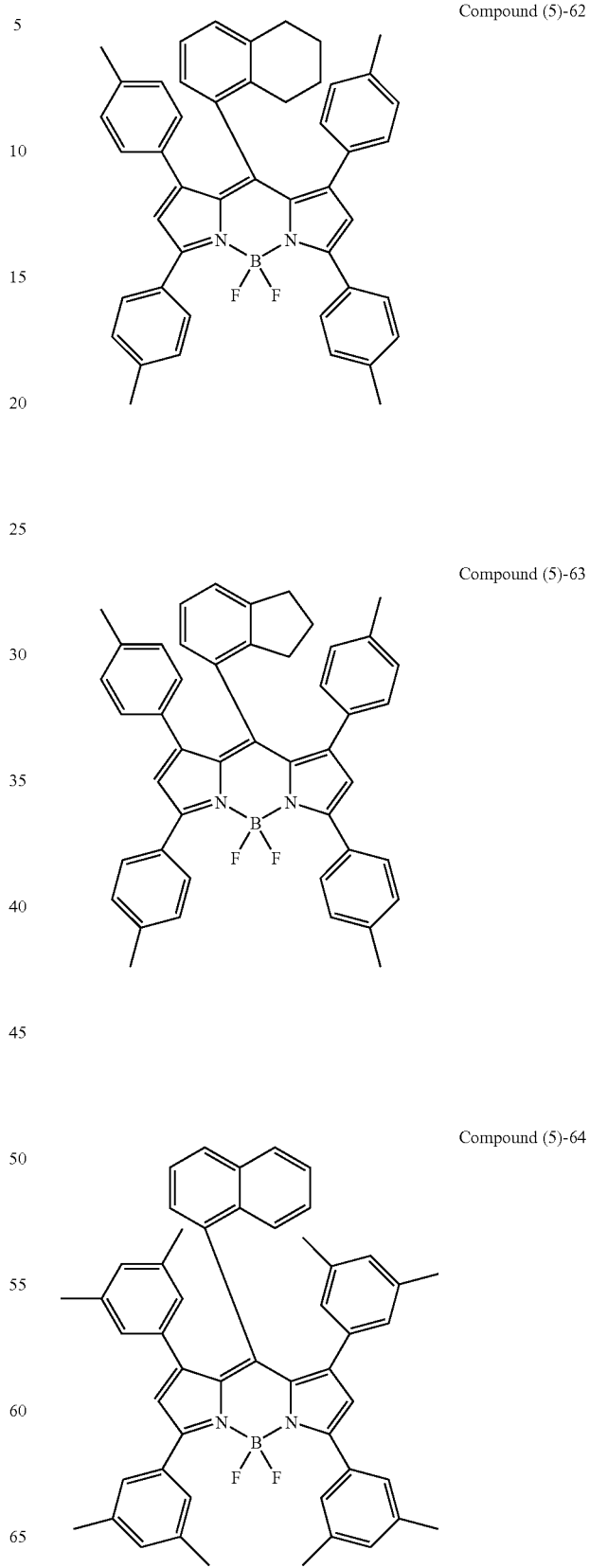
Compound (5)-63
Compound (5)-64

Compound (5)-65

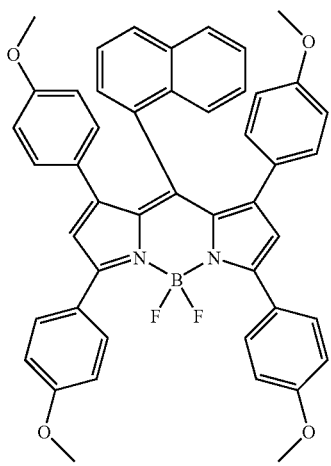

Compound (5)-66

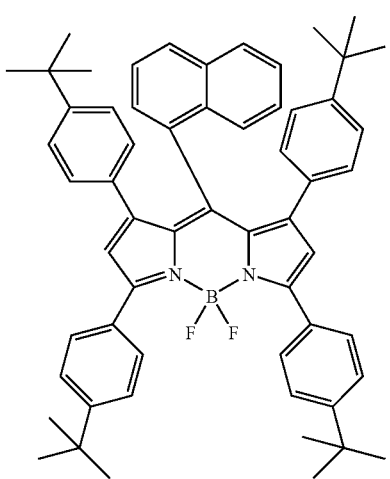

Compound (5)-67

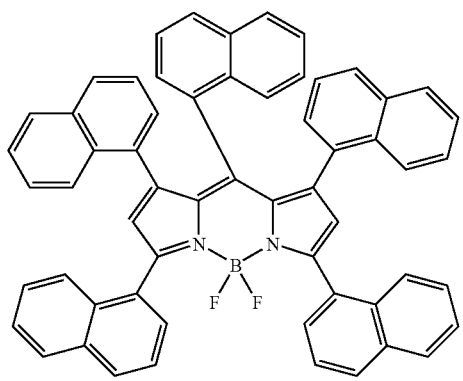

Compound (5)-68

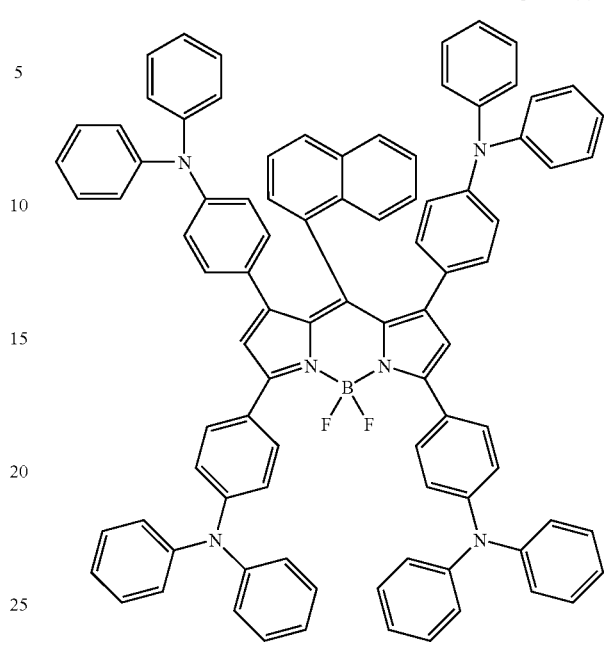

—Pyran Derivative—

For example, a compound represented by the following general formula (6) (pyran derivative) is used as the red light-emitting guest material.

General Formula (6)

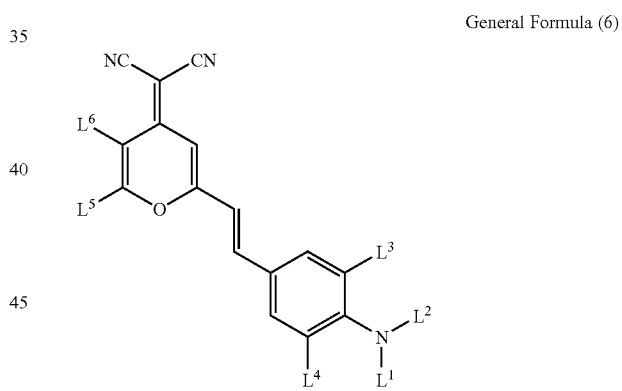

In the general formula (6), $L^1$ to $L^6$ each independently represents hydrogen, a substituted or unsubstituted alkyl group having not more than 20 carbon atoms, a substituted or unsubstituted alkenyl group having not more than 20 carbon atoms, a substituted or unsubstituted alkoxyl group having not more than 20 carbon atoms, a cyano group, a nitro group, a substituted or unsubstituted silyl group having not more than 30 carbon atoms, a substituted or unsubstituted aryl group having not more than 30 carbon atoms, a substituted or unsubstituted heterocyclic group having not more than 30 carbon atoms or a substituted or unsubstituted amino group having not more than 30 carbon atoms. Also, $L^1$ and $L^4$ or $L^2$ and $L^3$ may take a cyclic structure through a hydrocarbon.

In the general formula (6), the substituted or unsubstituted aryl group represented by $L^1$ to $L^6$, the heterocyclic group represented by $L^1$ to $L^6$ and the amino group represented by $L^1$ to $L^6$ are the same as those in the perylene derivative represented by the general formula (3). $L^1$ and $L^4$ or $L^2$ and $L^3$ may take a cyclic structure through a hydrocarbon. Besides, two or more kinds of the foregoing substituents may form a fused ring, and these substituents may further have a substituent.

Specific examples of the pyran derivative which is suitably used as the red light-emitting guest material in the light-emitting layer 14c include the following Compound (6)-1 to (6)-7. However, it should be appreciated that the embodiments are not limited thereto.

Compound (6)-1

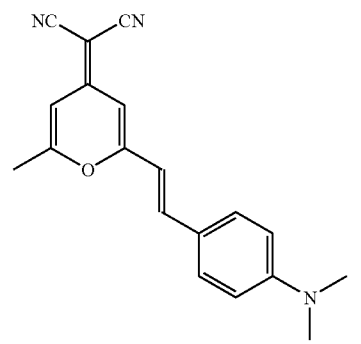

Compound (6)-2

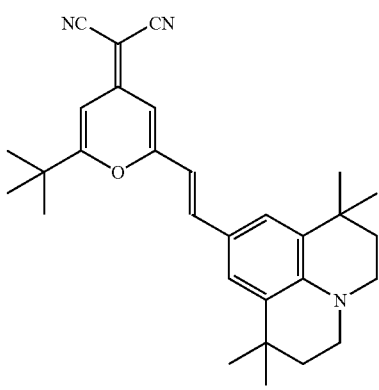

Compound (6)-3

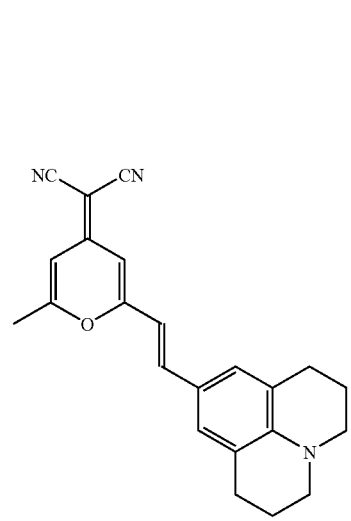

Compound (6)-4

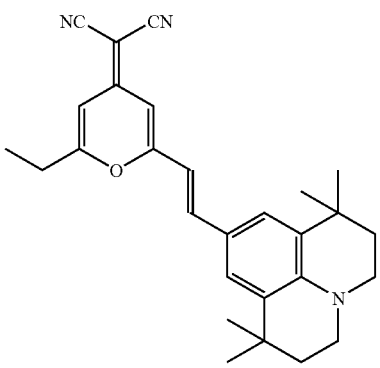

Compound (6)-5

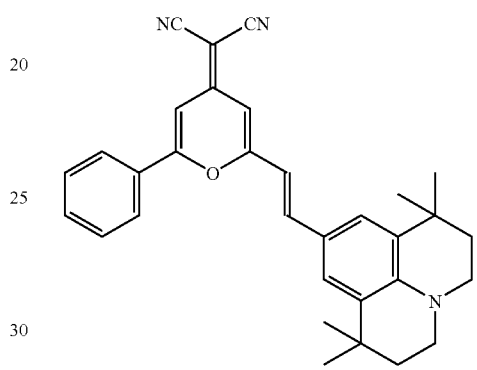

Compound (6)-6

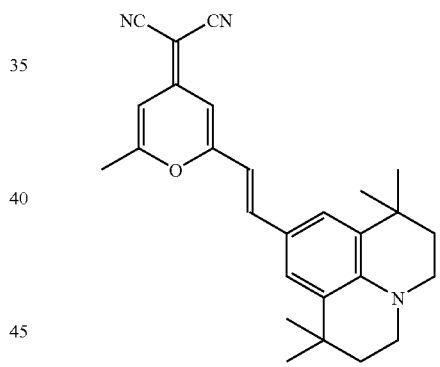

Compound (6)-7

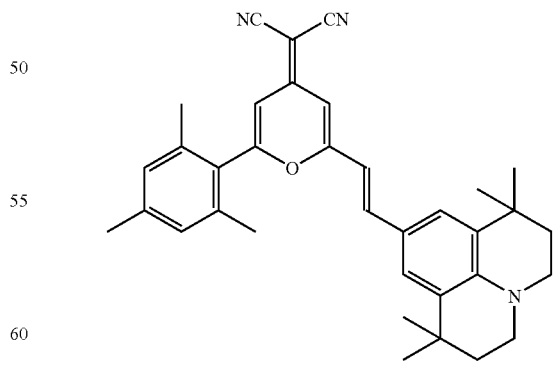

—Styryl Derivative—

For example, a compound represented by the following general formula (7) (styryl derivative) is used as the red light-emitting guest material.

General Formula (7)

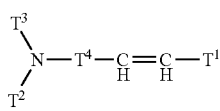

In the general formula (7), $T^1$ to $T^3$ each represents a substituted or unsubstituted aryl group having not more than 30 carbon atoms or a substituted or unsubstituted heterocyclic group having not more than 30 carbon atoms. Also, $T^4$ represents a substituted or unsubstituted phenylene site which may have a cyclic structure together with $T^2$ and $T^3$.

In the general formula (7), the substituted or unsubstituted aryl group represented by $T^1$ to $T^3$ and the heterocyclic group represented by $T^1$ to $T^3$ are the same as those in the perylene derivative represented by the general formula (3).

Two or more kinds of the foregoing substituents may form a fused ring, and these substituents may further have a substituent. In that case, examples of a group which is substituted on each of $T^1$ to $T^4$ include hydrogen, a halogen, a hydroxyl group, a substituted or unsubstituted carbonyl group having not more than 20 carbon atoms, a substituted or unsubstituted carbonyl ester group having not more than 20 carbon atoms, a substituted or unsubstituted alkyl group having not more than 20 carbon atoms, a substituted or unsubstituted alkenyl group having not more than 20 carbon atoms, a substituted or unsubstituted alkoxyl group having not more than 20 carbon atoms, a cyano group, a nitro group and an amino group. Besides, as the amino group, all of an alkylamino group, an arylamino group and an aralkylamino group, etc. are useful. It is preferable that these amino groups have an aliphatic group having from 1 to 6 carbon atoms in total and/or a monocyclic to tetracyclic aromatic carbon ring. Examples of such an amino group include a dimethylamino group, a diethylamino group, a dibutylamino group, a diphenylamino group, a ditolylamino group, a bisbiphenylylamino group and a dinaphthylamino group.

Specific examples of the styryl derivative which is suitably used as the red light-emitting guest material in the light-emitting layer 14c include the following Compound (7)-1 to (7)-35. However, it should be appreciated that the embodiments are not limited thereto.

Compound (7)-1

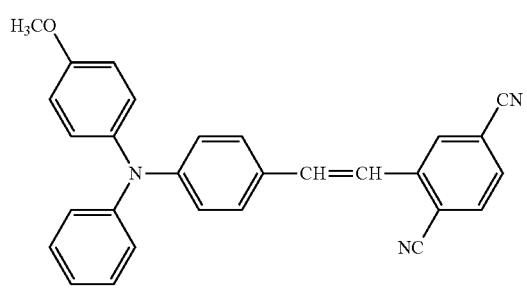

Compound (7)-2

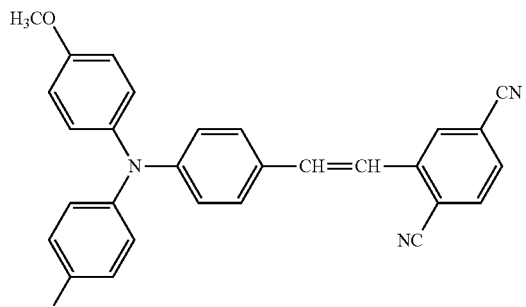

Compound (7)-3

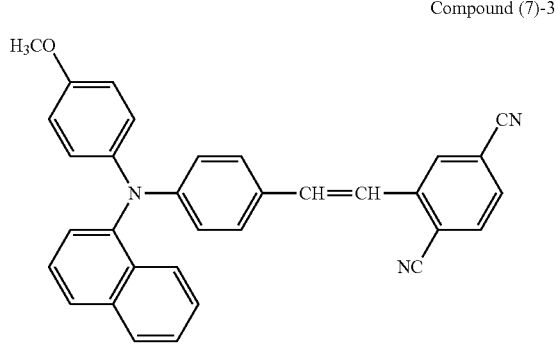

Compound (7)-4

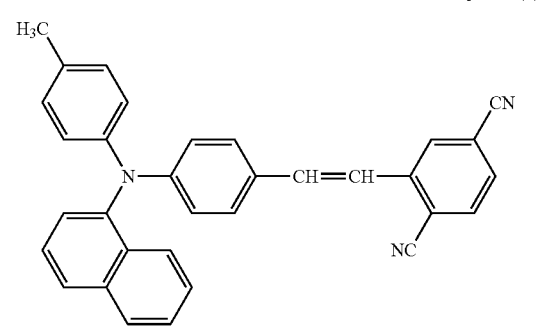

Compound (7)-5

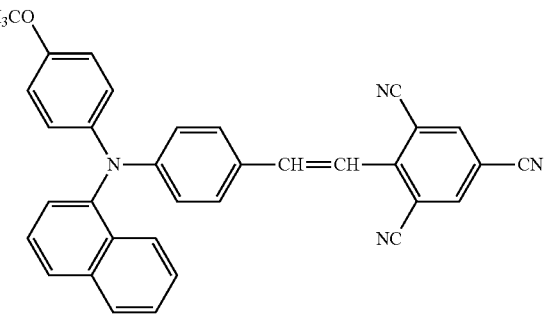

Compound (7)-6
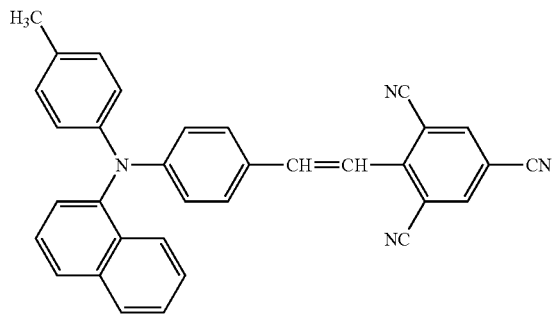
Compound (7)-7
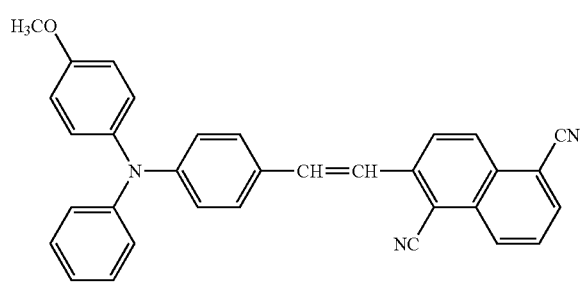
Compound (7)-8
Compound (7)-9
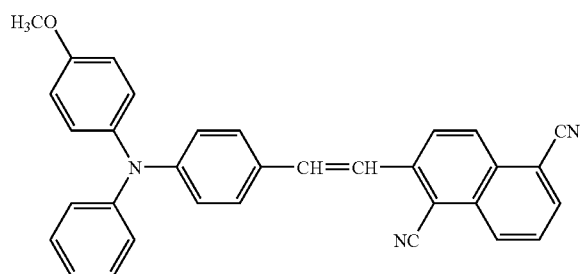
Compound (7)-10
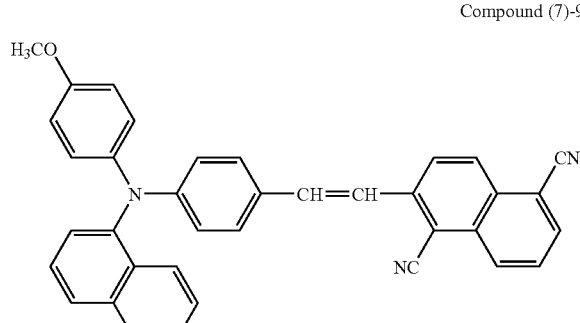
Compound (7)-11
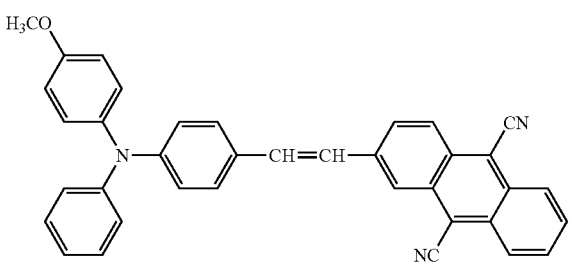
Compound (7)-12
Compound (7)-13
Compound (7)-14
Compound (7)-15
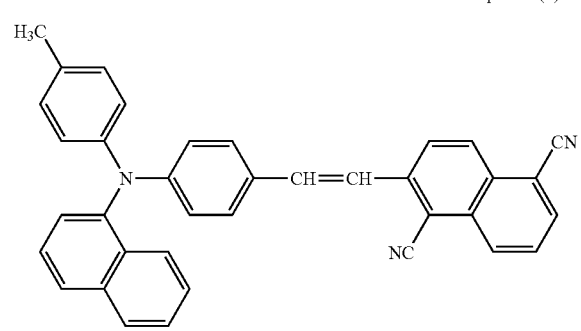

Compound (7)-16
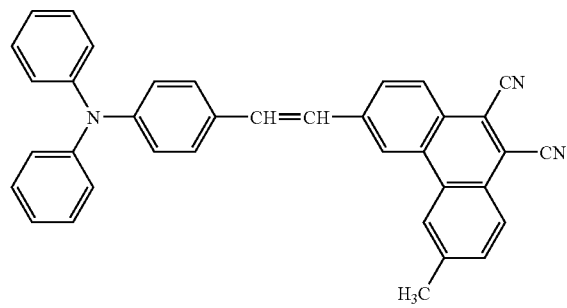
Compound (7)-17
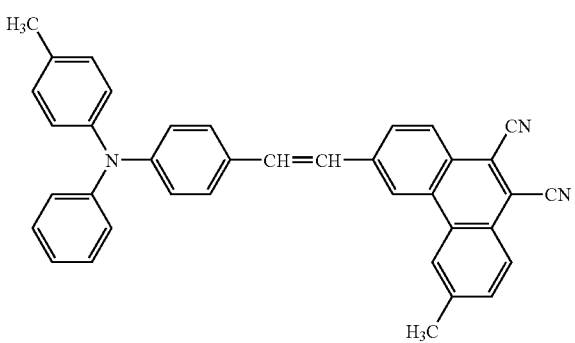
Compound (7)-18
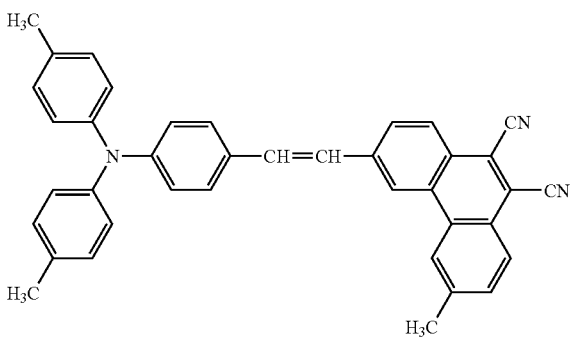
Compound (7)-19
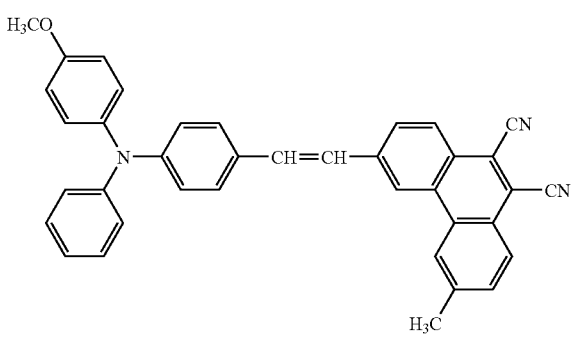
Compound (7)-20
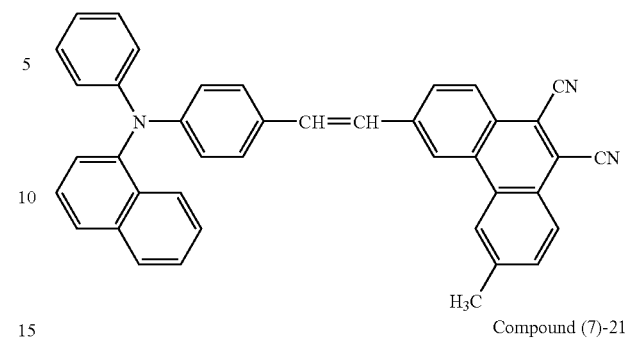
Compound (7)-21
Compound (7)-22
Compound (7)-23
Compound (7)-24

Compound (7)-25
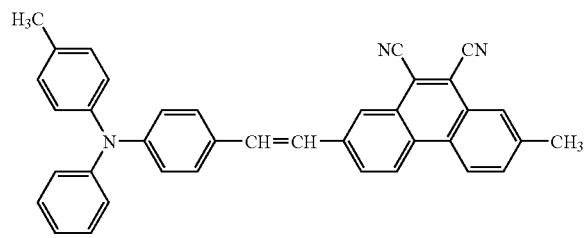
Compound (7)-30
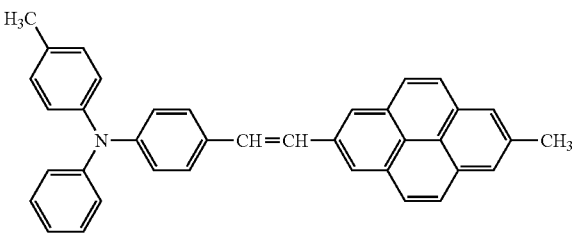
Compound (7)-26
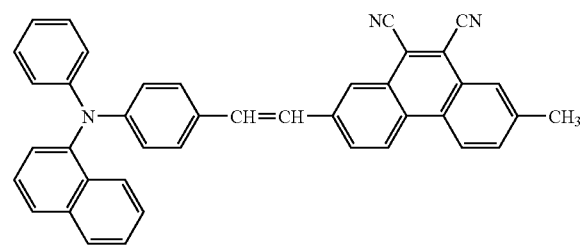
Compound (7)-31
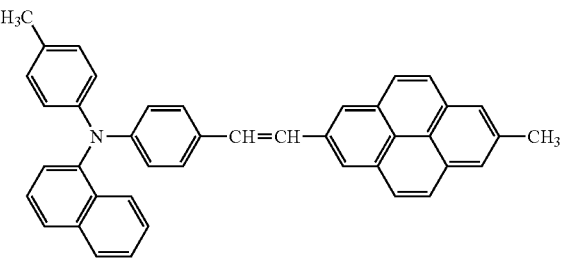
Compound (7)-27
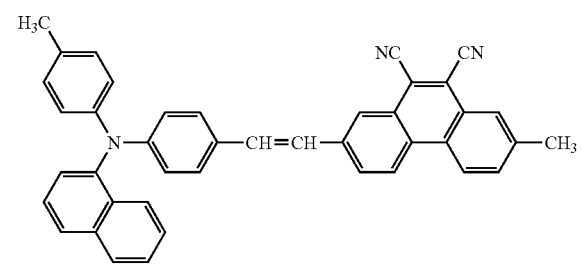
Compound (7)-32
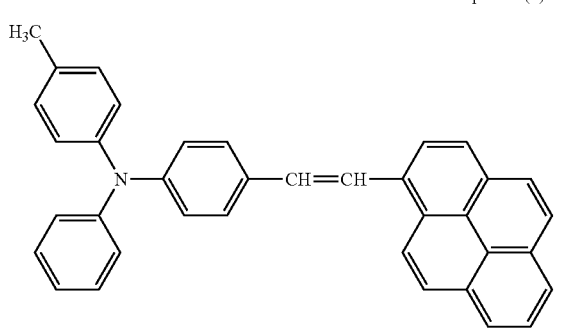
Compound (7)-28
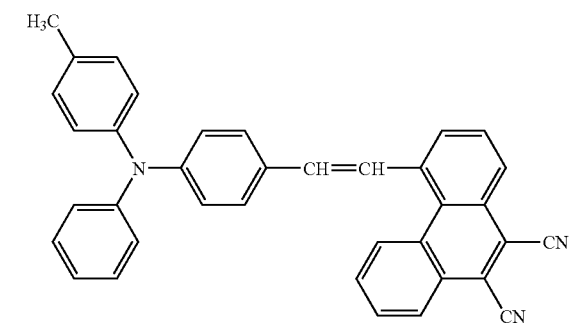
Compound (7)-33
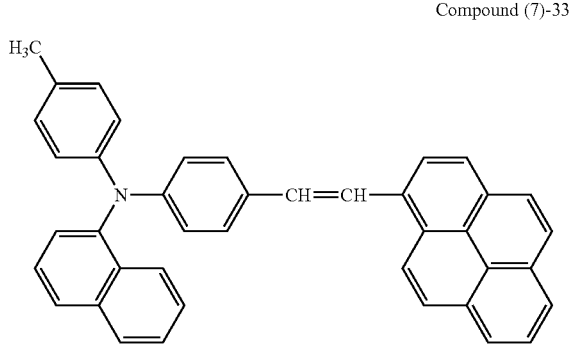
Compound (7)-29
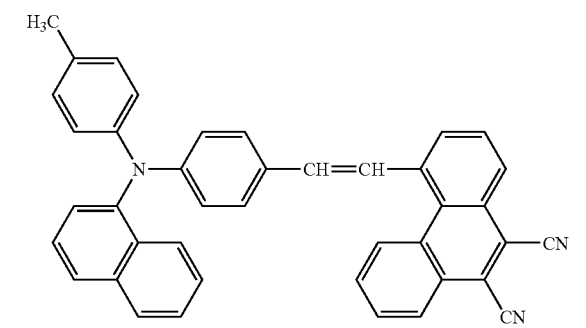
Compound (7)-34
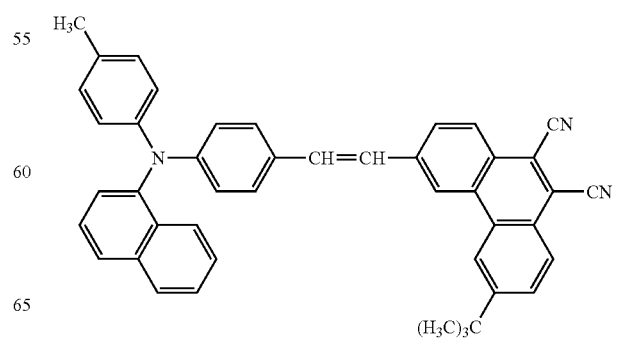

Compound (7)-35

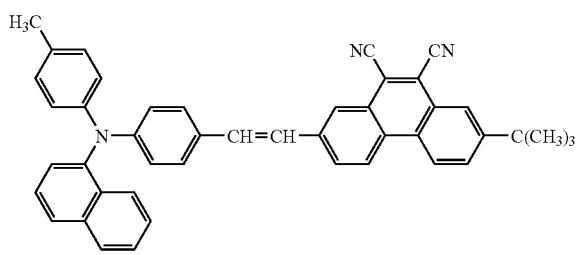

The perylene derivative of the general formula (3), the diketopyrrolopyrrole derivative of the general formula (4), the pyromethene derivative of the general formula (5), the pyran derivative of the general formula (6) or the styryl derivative of the general formula (7) as described below, each of which is used as the red light-emitting guest material in the light-emitting layer 14c, has a molecular weight of preferably not more than 2,000, more preferably not more than 1,500, and especially preferably not more than 1,000. This is because as a reason for this, there may be fear that when the molecular weight is excessively high, the vapor deposition properties become deteriorated in preparing a device by means of vapor deposition.

<Electron Transport Layer>

The electron transport layer 14d is provided for the purpose of transporting an electron injected from the cathode 15 into the light-emitting layer 14c. In the present embodiment, it is characterized by containing a benzimidazole derivative represented by the following general formula (1) in this electron transport layer 14d.

General Formula (1)

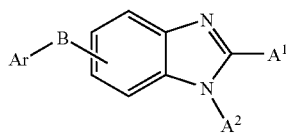

In the general formula (1), $A^1$ and $A^2$ each independently represents a hydrogen atom, a substituted or unsubstituted aryl group having not more than 60 carbon atoms, a substituted or unsubstituted heterocyclic group, a substituted or unsubstituted alkyl group having from 1 to 20 carbon atoms or an alkoxy group having from 1 to 20 carbon atoms.

In the general formula (1), B represents a substituted or unsubstituted arylene group having not more than 60 carbon atoms, a pyridinylene group which may have a substituted or unsubstituted group, a quinolinylene group which may have a substituent or a fluorenylene group which may have a substituent.

In the general formula (1), Ar represents a substituted or unsubstituted aryl group having from 6 to 60 carbon atoms, a substituted or unsubstituted heterocyclic group, a substituted or unsubstituted alkyl group having from 1 to 20 carbon atoms or a substituted or unsubstituted alkoxy group having from 1 to 20 carbon atoms.

Specific examples of such a benzimidazole derivative are given in the following Tables 1-1 to 1-6 while the constitutional segments of the general formula (1) are divided in four as described below.

TABLE 1-1

General Formula (1)

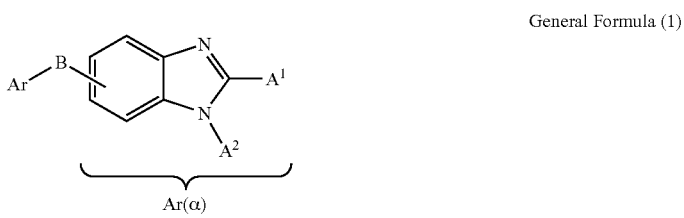

| | Ar(α) | B | Ar | |
|---|---|---|---|---|
| | Ar(α) | B | Ar(1) | Ar(2) |
| (1)-1 | benzimidazole-pyridine | p-phenylene | 9,10-anthracene | 2-naphthyl |
| (1)-2 | benzimidazole-pyridine | p-phenylene | 9,10-anthracene | 2-naphthyl |

TABLE 1-1-continued
General Formula (1)
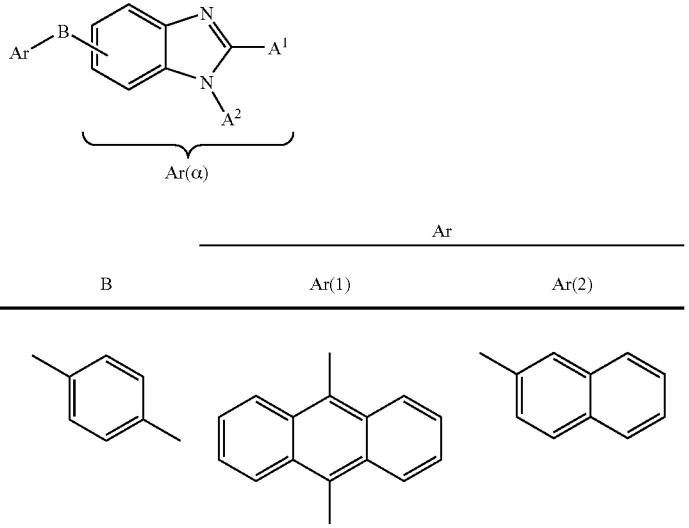
| | Ar(α) | B | Ar | |
|---|---|---|---|---|
| | | | Ar(1) | Ar(2) |
| (1)-3 | 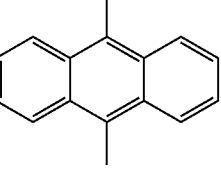 | 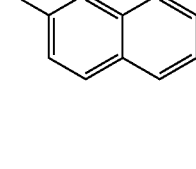 | 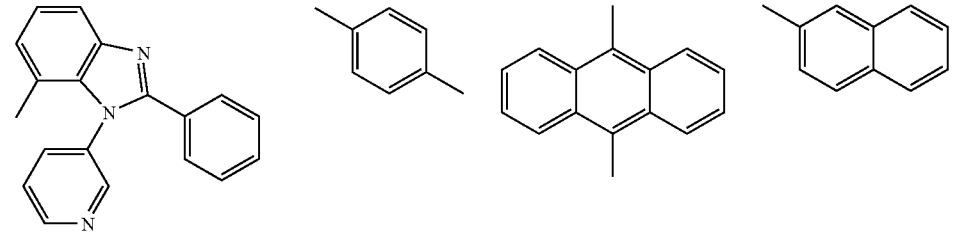 | 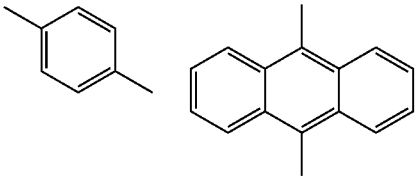 |
| (1)-4 | 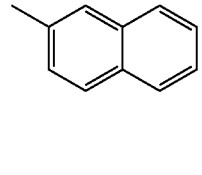 | 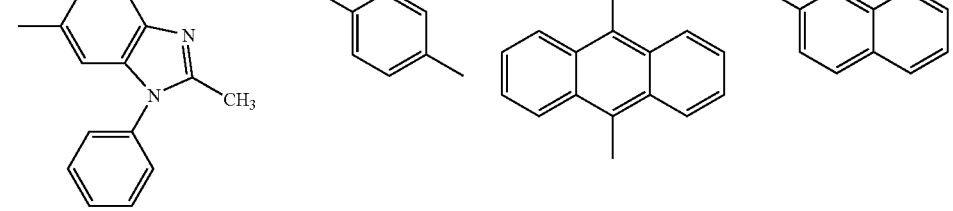 | 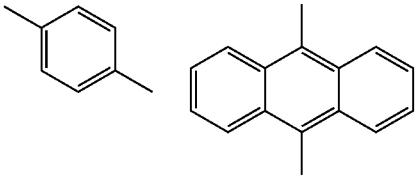 | 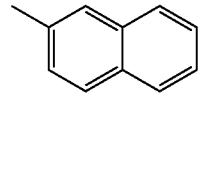 |
| (1)-5 | 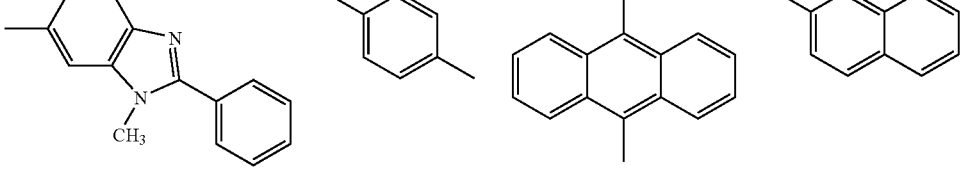 | 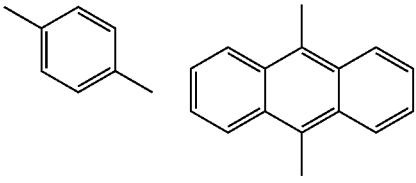 | 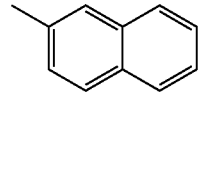 | 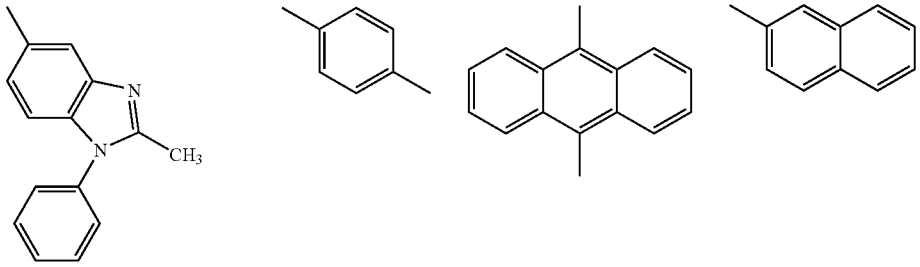 |
| (1)-6 | 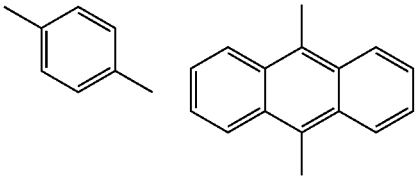 | | | |
| (1)-7 | 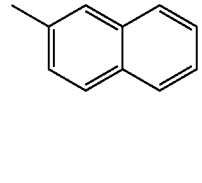 | | | |

TABLE 1-1-continued

General Formula (1)

| | Ar(α) | B | Ar(1) | Ar(2) |
|---|---|---|---|---|
| | | | Ar | |
| (1)-8 | [5-methyl-1-methyl-2-phenyl-benzimidazole] | [p-phenylene] | [9,10-dimethylanthracene] | [2-methylnaphthalene] |
| (1)-9 | [1,5-dimethyl-2-phenyl-benzimidazole] | [p-phenylene] | [9,10-dimethylanthracene] | [1-methylnaphthalene] |
| (1)-10 | [5-methyl-1,2-diphenyl-benzimidazole] | [p-phenylene] | [9,10-dimethylanthracene] | [1-methylnaphthalene] |

TABLE 1-2

| | Ar(α) | B | Ar(1) | Ar(2) |
|---|---|---|---|---|
| | | | Ar | |
| (1)-11 | [5-methyl-1,2-diphenyl-benzimidazole] | [p-phenylene] | [9,10-dimethylanthracene] | [4-biphenyl] |
| (1)-12 | [5-methyl-1-methyl-2-phenyl-benzimidazole] | [p-phenylene] | [9,10-dimethylanthracene] | [2-biphenyl] |

TABLE 1-2-continued
| | Ar(α) | B | Ar | |
| --- | --- | --- | --- | --- |
| | | | Ar(1) | Ar(2) |
| (1)-13 | 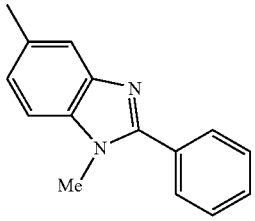 | 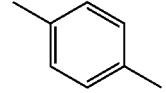 | 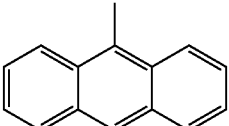 | 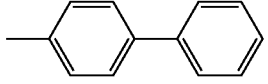 |
| (1)-14 | 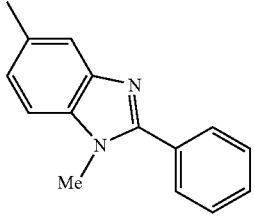 | 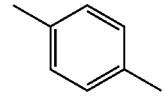 | 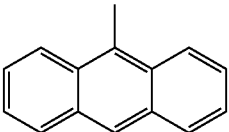 | 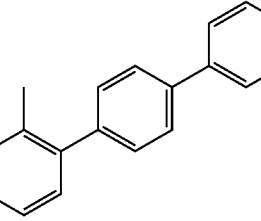 |
| (1)-15 | 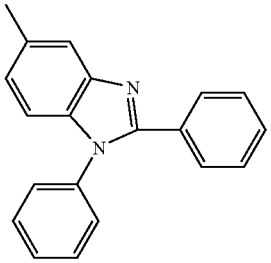 | 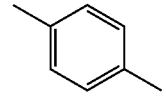 | 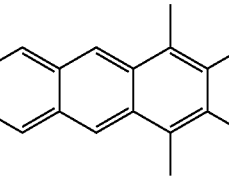 | 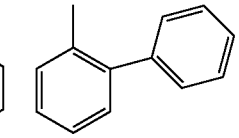 |
| (1)-16 | 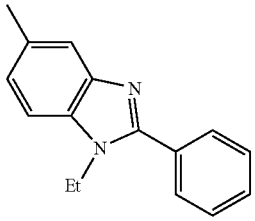 | 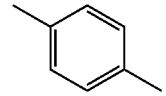 | 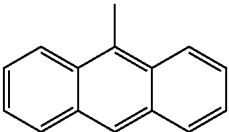 | 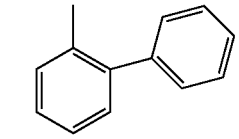 |
| (1)-17 | 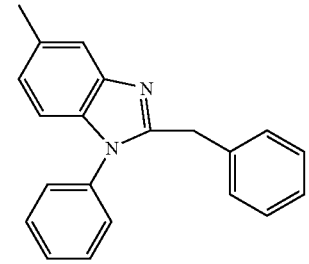 | 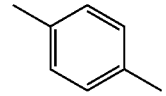 | 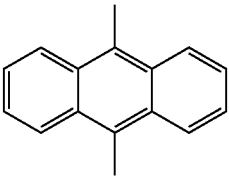 | 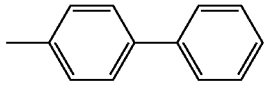 |
| (1)-18 | 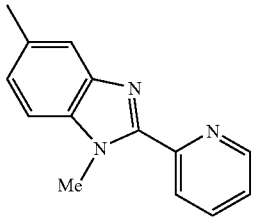 | 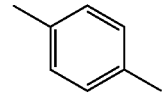 | 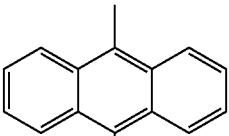 | 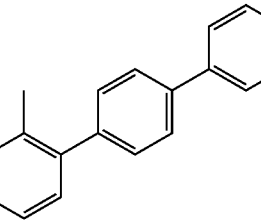 |

TABLE 1-3

| | Ar(α) | B | Ar | |
| --- | --- | --- | --- | --- |
| | | | Ar(1) | Ar(2) |
| (1)-19 | | | | |
| (1)-20 | | | | |
| (1)-21 | | | | |
| (1)-22 | | | | |
| (1)-23 | | | | |
| (1)-24 | | | | |

TABLE 1-4
| | Ar(α) | B | Ar |
|---|---|---|---|
| (1)-25 | 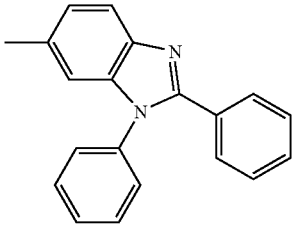 | 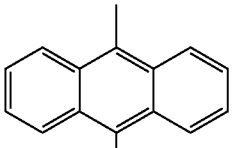 | 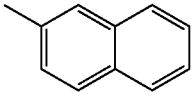 |
| (1)-26 | 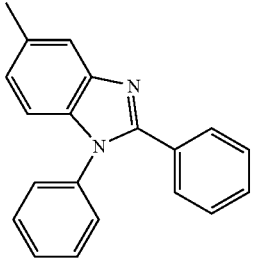 | 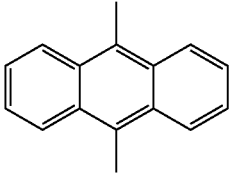 | 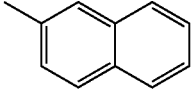 |
| (1)-27 | 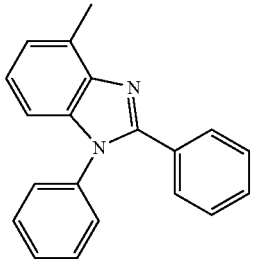 | 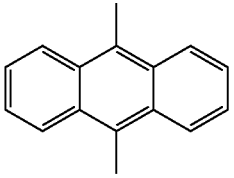 | 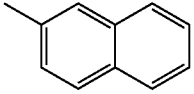 |
| (1)-28 | 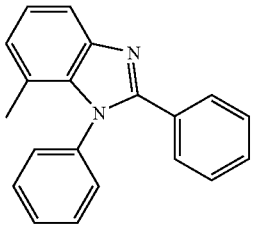 | 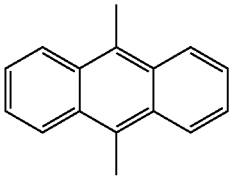 | 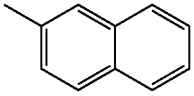 |
| (1)-29 | 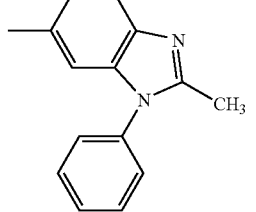 | 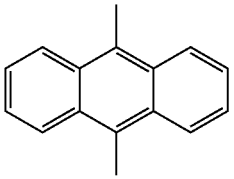 | 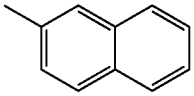 |
| (1)-30 | 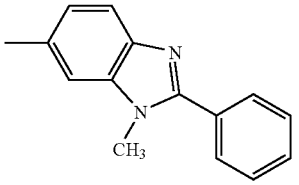 | 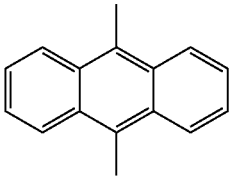 | 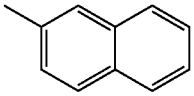 |

TABLE 1-4-continued

| | Ar(α) | B | Ar |
|---|---|---|---|
| (1)-31 | | | |
| (1)-32 | | | |

TABLE 1-5

| | Ar(α) | B | Ar |
|---|---|---|---|
| (1)-33 | | | |
| (1)-34 | | | |
| (1)-35 | | | |

TABLE 1-5-continued
| | Ar(α) | B | Ar |
|---|---|---|---|
| (1)-36 | 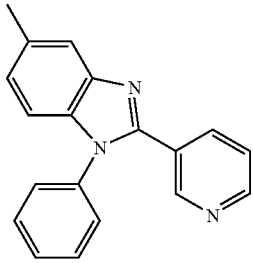 | 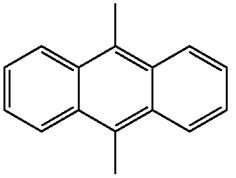 | 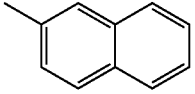 |
| (1)-37 | 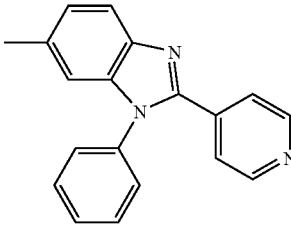 | 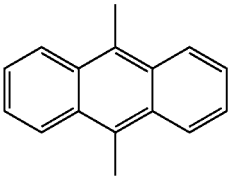 | 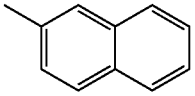 |
| (1)-38 | 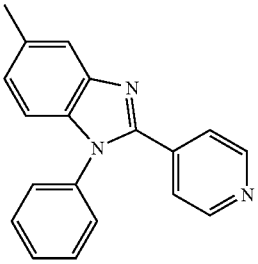 | 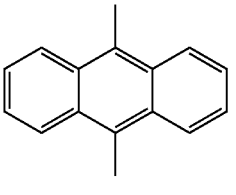 | 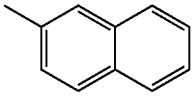 |
| (1)-39 | 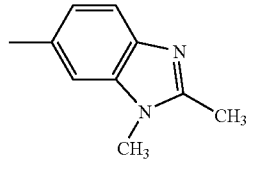 | 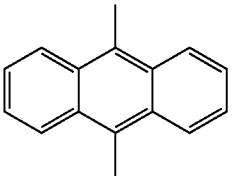 | 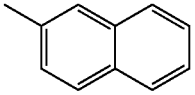 |
| (1)-40 | 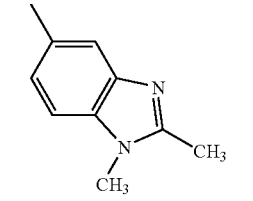 | 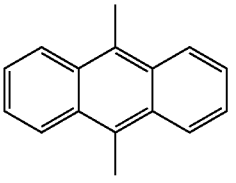 | 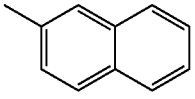 |
TABLE 1-6
| | Ar(α) | B | Ar |
|---|---|---|---|
| (1)-41 | 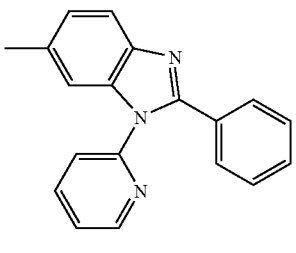 | 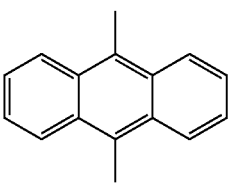 | 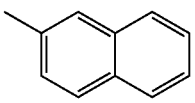 |

TABLE 1-6-continued

| | Ar(α) | B | Ar |
|---|---|---|---|
| (1)-42 | | | |
| (1)-43 | | | |
| (1)-44 | | | |
| (1)-45 | | | |
| (1)-46 | | | |
| (1)-47 | | | |

TABLE 1-6-continued

| Ar(α) | B | Ar |
|---|---|---|
| (1)-48 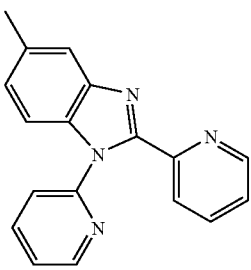 | 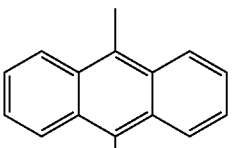 | 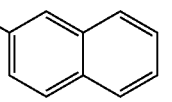 |

The electron transport layer 14d which is constituted of such a benzimidazole derivative has a characteristic for plentifully supplying an electron to the light-emitting layer 14c.

This electron transport layer 14d may contain at least one benzimidazole derivative or may contain plural kinds thereof. In that case, plural kinds of the benzimidazole derivative may be contained in the electron transport layer 14d of a single-layered structure. Also, layers constituted of a different kind of the benzimidazole derivative may be stacked to configure the electron transport layer 14d. Furthermore, the electron transport layer 14d may be configured of a combination of these constructions. In the case where a layer containing plural kinds of benzimidazole derivatives is provided on the electron transport layer 14d, plural kinds of the benzimidazole derivatives may be subjected to simultaneous vapor deposition.

The organic layer 14 configured of the foregoing respective layers is not limited to these layer structures but may be configured to have the red light-emitting layer 14c containing, as a host material, a polycyclic aromatic hydrocarbon compound whose mother skeleton has a ring member number of from 4 to 7 and the electron transport layer 14d containing a benzimidazole derivative represented by the general formula (1), which comes into contact with the light-emitting layer 14c.

For example, each of the layers configuring the foregoing organic layer 14, for example, the hole injection layer 14a, the hole transport layer 14b, the light-emitting layer 14c and the electron transport layer 14d may have a stack structure composed of plural layers.

<Cathode>

Next, the cathode 15 which is provided on the organic layer 14 having the foregoing configuration may be configured by a two-layer structure, for example, a stack of a first layer 15a and a second layer 15b from the side of the organic layer 14.

The first layer 15a is configured by using a material having a small work function and having good light transmittance. Examples of the material which can be used include lithium oxide ($Li_2O$) which is an oxide of lithium (Li), cesium carbonate ($Cs_2CO_3$) which is a composite oxide of cesium (Cs) and a mixture of such oxide and composite oxide. The first layer 15a is not limited to these materials. For example, alkaline earth metals (for example, calcium (Ca) and barium (Ba)), alkali metals (for example, lithium and cesium), metals having a small work function (for example, indium (In) and magnesium (Mg)), and oxides or composite oxides and fluorides of these metals and the like may be used singly. Also, mixtures or alloys of these metals, oxides or composite oxides and fluorides may be used by enhancing the stability.

The second layer 15b is configured by a thin film using a layer having light transmittance, for example, MgAg. The second layer 15b may be a mixed layer further containing an organic light-emitting material, for example, alumiquinoline complexes, styrylamine derivatives and phthalocyanine derivatives. In that case, the cathode 15 may further have a layer having light transmittance, which is made of, for example, MgAg, separately as a third layer.

When the drive mode of a display apparatus configured by using this organic electroluminescent device 11 is an active matrix mode, the cathode 15 is formed in a solid film form on the substrate 12 in an insulated state from the anode 13 by the organic layer 14 and the foregoing insulating film (illustration of which is omitted) and used as a common electrode of the respective pixels.

The cathode 15 is not limited to the foregoing stack structure. Needless to say, optimum combination and stack structure may be taken depending upon the structure of the device to be prepared. For example, the configuration of the cathode 15 of the foregoing embodiment is of a separated function type of respective layers of the electrode, namely a stack structure where an inorganic layer (first layer 15a) for promoting the electron injection into the organic layer 14 and an inorganic layer (second layer 15b) for taking charge of the electrode are separated. However, the inorganic layer for promoting the electron injection into the organic layer 14 may also serve as the inorganic layer for taking charge of the electrode. These layers may be configured as a single-layer structure. Also, a stack structure where a transparent electrode such as ITO is formed on this single-layer structure may be taken.

Though the current to be applied to the organic electroluminescent device 11 having the foregoing configuration is in general a direct current, a pulse current or an alternating current may be employed, too. A current value and a voltage value are not particularly limited within the range where the device is not broken. Taking into consideration consumed electric power and life of the organic electroluminescent device, it is desirable that the organic electroluminescent device efficiently undergoes emission with low electric energy as far as possible.

When the organic electroluminescent device 11 is of a cavity structure, the cathode 15 is configured by using a semi-transmitting and semi-reflecting material. Light-emitting light which has been subjected to multiple interference between the light-reflecting surface on the side of the anode 13 and the light-reflecting surface on the side of the cathode 15 is extracted from the side of the cathode 15. In that case, an optical distance between the light-reflecting surface on the side of the anode 13 and the light-reflecting surface on the side of the cathode 15 is regulated by a wavelength of light to be extracted, and the thickness of each layer is set up so as to meet this optical distance. In the organic electroluminescent device of such a top emission type, by positively employing this cavity structure, it is possible to improve the light extraction efficiency into the outside or to control the emission spectrum.

Furthermore, while illustration is omitted, it is preferable that the organic electroluminescent device 11 having the foregoing configuration is used in a state that it is covered by a passivation layer for the purpose of preventing the deterioration of the organic material to be caused due to moisture, oxygen and the like in the air. As the passivation film, for example, a silicon nitride (representatively $Si_3N_4$) film, a silicon oxide (representatively $SiO_2$) film, a silicon nitride oxide ($SiN_xO_y$, composition ratio: x>y) film, a silicon oxide nitride ($SiO_xN_y$, composition ratio: x>y) film, a thin film containing carbon as a main component, for example, DLC (diamond-like carbon) and a CN (carbon nanotube) film are useful. It is preferable that such a film is of a single-layer or stacked configuration. Above all, a passivation layer composed of a nitride is preferably used because it has a minute film quality and has an extremely high blocking effect against moisture, oxygen and other impurities which adversely affect the organic electroluminescent device 11.

The foregoing embodiment, has been described in detail while exemplifying the case where the organic electroluminescent device is of a top emission type. However, the organic electroluminescent device according to an embodiment is not limited to the application to the top emission type but is widely applicable to a configuration in which an organic layer containing at least a light-emitting layer is interposed between an anode and a cathode. Accordingly, the organic electroluminescent device according to an embodiment is also applicable to one having a configuration in which a cathode, an organic layer and an anode are stacked in this order from a substrate side; and one of a bottom emission type (so-called transmission type) having a configuration in which an electrode positioning on a substrate side (lower electrode as a cathode or an anode) is composed of a transparent material and an electrode positioning at an opposite side to the substrate (upper electrode as a cathode or an anode) is composed of a reflecting material, thereby extracting light only from the lower electrode side.

Furthermore, the organic electroluminescent device of an embodiment may be a device formed of a pair of electrodes (an anode and a cathode) and an organic layer interposed between the electrodes. For that reason, an embodiment is not limited to the organic electroluminescent device configured of only a pair of electrodes and an organic layer but does not exclude an organic electroluminescent device having a configuration in which other constitutional elements (for example, an inorganic compound layer and an inorganic component) coexist so far as the effects of an embodiment according are not impaired.

As described in detail in the Examples as described later, in the thus configured organic electroluminescent device 11, it was confirmed that the current efficiency (luminous efficiency) increases and that a long life is realized as compared with the related-art configuration using an electron transport material.

It is considered to be caused due to the matter that by providing the electron transport layer 14d constituted of a benzimidazole derivative while coming into contact with the red light-emitting layer 14c, an electron is plentifully supplied to the light-emitting layer 14c. According to this, almost all of holes supplied from the hole transport layer 14b to the light-emitting layer 14c are recombined with a large quantity of electrons supplied from the electron transport layer 15d in the light-emitting layer 14c, thereby contributing to the emission in the light-emitting layer 14c. Accordingly, not only the luminous efficiency is enhanced, but the hole-electron recombination region is effectively controlled within only the light-emitting layer 14c, whereby satisfactory high-purity red emission composed of only emission of the light-emitting layer 14c is obtainable.

According to the organic electroluminescent device 11 having the forgoing configuration, it is possible to attain an enhancement of luminous efficiency of red light-emitting light while keeping color purity and to realize a long life.

Also, it is possible to attain an enhancement of brightness life of the organic electroluminescent device 11 and a reduction of consumed electric power by such a great improvement of the luminous efficiency.

<<Diagrammatic Configuration Of Display Apparatus>>

Figure 2A:
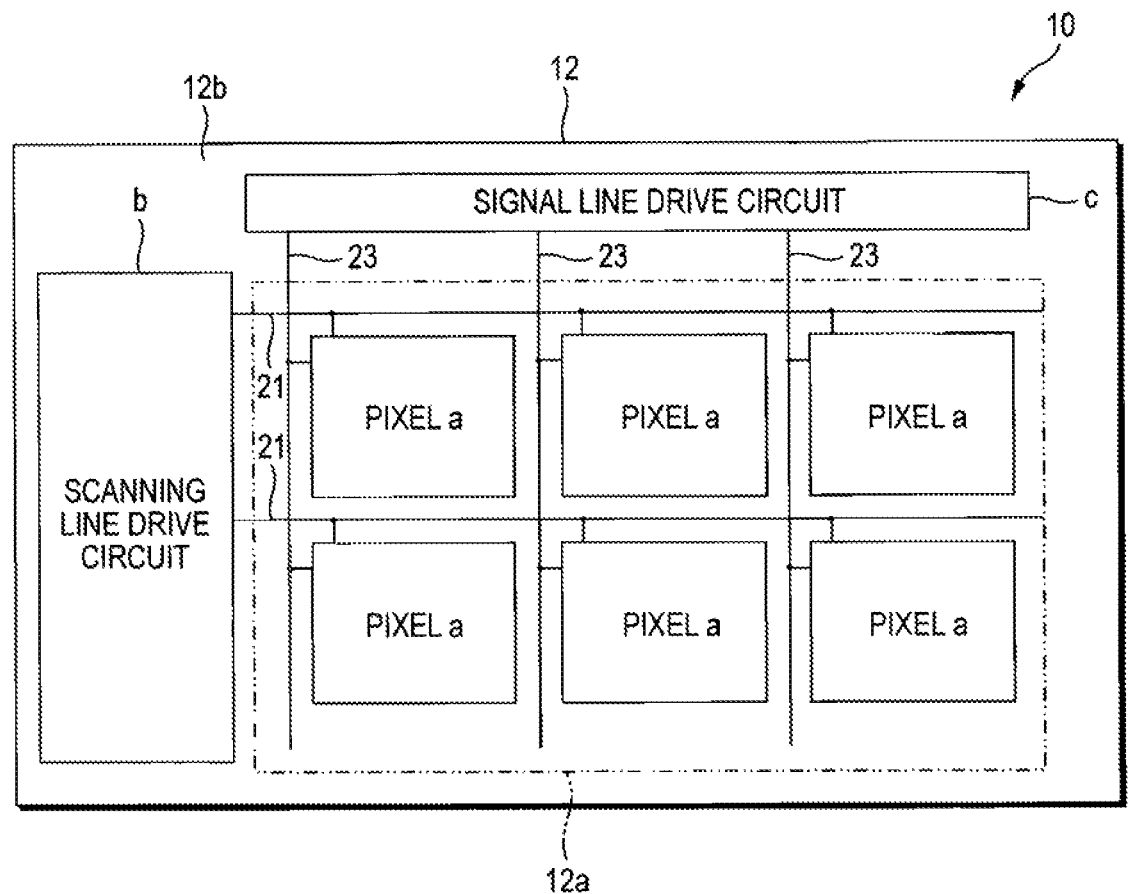
FIGS. 2A and 2B are each a view showing one example of a circuit configuration of a display apparatus according to an embodiment.
Figure 2B:
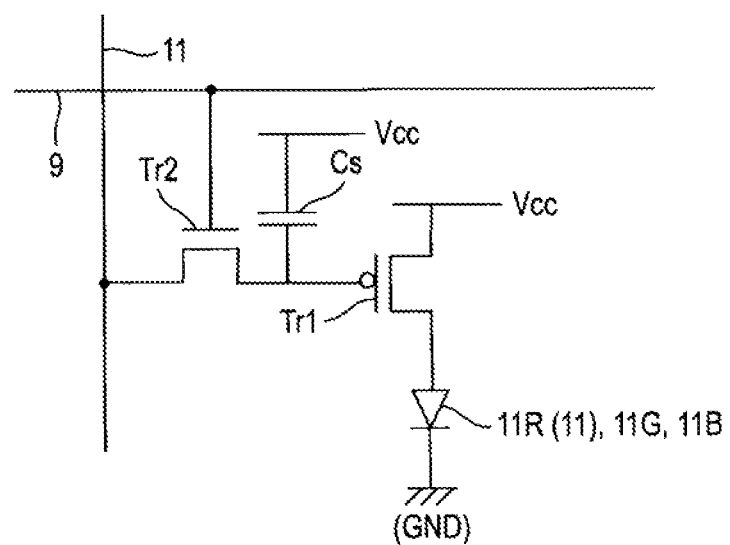

FIGS. 2A and 2B are views showing one example of a display apparatus 10 according to an embodiment, in which FIG. 2A is a diagrammatic configuration view and FIG. 2B is a configuration view of a pixel circuit. Here, an embodiment is applied to a display apparatus 10 of an active matrix mode using the organic electroluminescent device 11 as a light-emitting device is illustrated.

As illustrated in FIG. 2A, a display region 12a and a circumferential region 12b thereof are set up on the substrate 12 of this display apparatus 10. In the display region 12a, plural scanning lines 21 and plural signal lines 23 are wired longitudinally and laterally, and a pixel array portion in which one pixel a is provided corresponding to an intersection therebetween is configured. Each pixel a is provided with one of organic electroluminescent devices 11R (11), 11G and 11B. Also, in the circumferential region 12b, a scanning line drive circuit b for scanning and driving the scanning lines 21 and a signal line drive circuit c for feeding a picture image signal (namely an input signal) corresponding to the brightness information to the signal lines 23 are arranged.

As illustrated in FIG. 2B, the pixel circuit provided in each pixel a is configured of, for example, one of the respective organic electroluminescent devices 11R (11), 11G and 11B, a drive transistor Tr1, a write transistor (sampling transistor) Tr2 and a storage capacitor Cs. Due to the drive by the scanning line drive circuit b, a picture image signal written from the signal lines 23 via the write transistor Tr2 is stored in the storage capacitor Cs; a current corresponding to the amount of the stored signal is fed to each of the organic electroluminescent devices 11R (11), 11G and 11B; and each of the organic electroluminescent devices 11R (11), 11G and 11B undergoes emission with a brightness corresponding to this current value.

The foregoing configuration of the pixel circuit is one example to the last, and the pixel circuit may be configured by providing a capacity device or further providing plural transistors within the pixel circuit as the need arises. Also, a necessary drive circuit is added in the circumferential region 2b corresponding to the change of the pixel circuit.

<<Cross-Sectional Configuration of Display Apparatus>>

Figure 3:
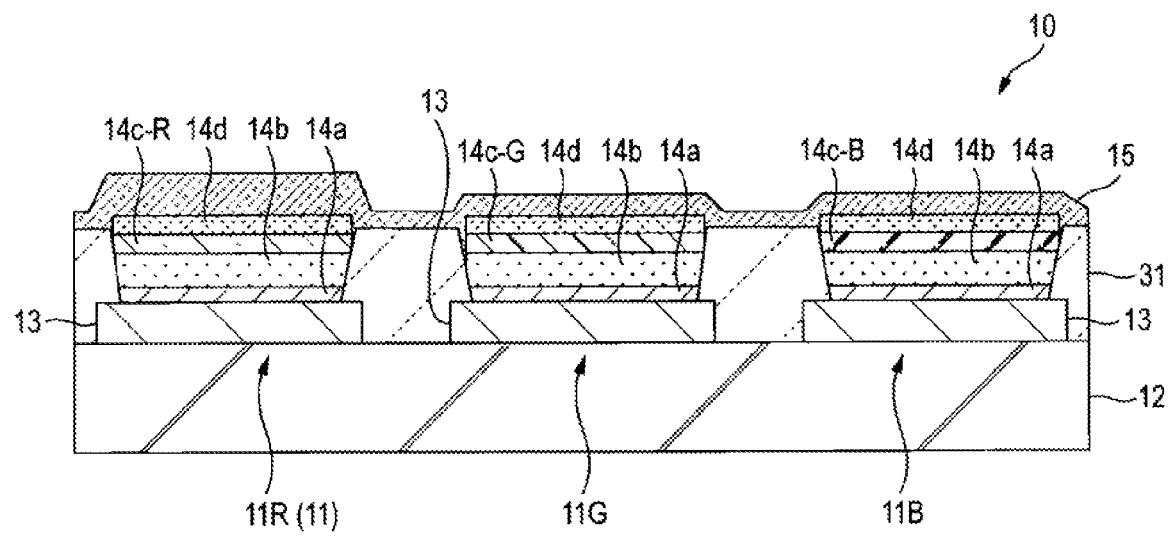
FIG. 3 is a view showing one example of a cross-sectional configuration of the essential part in a display apparatus according to an embodiment.

FIG. 3 is a view showing one example of a cross-sectional configuration of the essential part in the display region of the foregoing display apparatus 10.

In the display region of the substrate 12 in which the organic electroluminescent devices 11R (11), 11G and 11B are provided, while illustration is omitted, a drive transistor, a write transistor, scanning lines and signal lines are provided so as to configure the foregoing pixel circuit (see FIGS. 2A and 2B), and an insulating film is provided in a state of covering them.

The organic electroluminescent devices 11R (11), 11G and 11B are aligned and formed on the substrate 12 covered by this insulating film. Each of the organic electroluminescent devices 11R (11), 11G and 11B is configured as a device of a top emission type for extracting light from an opposite side to the substrate 12.

The anode 13 of each of the organic electroluminescent devices 11R (11), 11G and 11B is pattern formed in every device. Each of the anodes 13 is connected to the drive transistor of the pixel circuit via a connection hole formed in the insulating film which covers the surface of the substrate 12.

In each of the anodes 13, its surrounding is covered by an insulating film 31, and a center of the anode 13 is exposed in an aperture portion provided in the insulating film 31. The organic layer 14 is pattern formed in a state of covering the exposed portion of the anode 13, and the cathode 15 is provided as a common layer for covering the respective organic layers 14.

Of these organic electroluminescent devices 11R (11), 11G and 11B, in particular, the red light-emitting device 11R is configured as the organic electroluminescent device (11) in the embodiment as described above by referring to the foregoing FIG. 1. On the other hand, the green light-emitting device 11G and the blue light-emitting device 11B may be each of a usual device configuration.

Namely, in the red light-emitting device 11R (11), the organic layer 14 provided on the anode 13 is, for example, a stack of the hole injection layer 14a, the hole transport layer 14b, a red light-emitting layer 14c-R (14c) using a naphthacene derivative as a host material and the electron transport layer 14d in this order from the side of the anode 13.

On the other hand, the organic layer in each of the green light-emitting device 11G and the blue light-emitting device 11B is, for example, a stack of the hole injection layer 14a, the hole transport layer 14b, light-emitting layers 14c-G and 14c-B of respective colors and the electron transport layer 14d in this order from the side of the anode 13.

The thus provided plural organic electroluminescent devices 11R (11), 11G and 11B are covered by a passivation film. This passivation film is provided so as to cover the whole of the display region in which the organic electroluminescent devices 11R, 11G and 11B are provided.

Here, each of the layers including from the anode 13 to the cathode 15, which configure the red light-emitting device 11R (11), the green light-emitting device 11G and the blue light-emitting device 11B, respectively, can be formed by a dry process, for example, a vacuum vapor deposition method, an ion beam method (EB method), a molecular beam epitaxy method (MBE method), a sputtering method and an organic vapor phase deposition (OVPD) method.

Also, so far as an organic layer is concerned, in addition to the foregoing methods, a wet process, for example, a coating method (for example, a laser transfer method, a spin coating method, a dipping method, a doctor blade method, a discharge coating method and a spray coating method) and a printing method (for example, an inkjet method, an offset printing method, a letterpress printing method, an intaglio printing method, a screen printing method and a microgravure coating method) can be employed for the formation. The dry process and the wet process may be used jointly depending upon the properties of each organic layer and each material.

The organic layer 14 which has been thus pattern formed for every device of the organic electroluminescent devices 11R (11), 11G and 11B is, for example, formed by a vapor deposition method or a transfer method using a mask.

In the thus configured display apparatus 10 of the first example, the organic electroluminescent device (11) of the configuration according to an embodiment as described above by referring to FIG. 1 is used as the red light-emitting device 11R. As described previously, this red light-emitting device 11R (11) has high luminous efficiency while keeping the red luminous color. For that reason, it is possible to undergo full-color display with high color expression properties by combining the green light-emitting device 11G and the blue light-emitting device 11B together with this red light-emitting device 11R (11).

Also, by using the organic electroluminescent device (11) with high luminous efficiency, the display apparatus 10 is brought with effects that not only the brightness life can be improved, but a consumed electric power can be reduced. Accordingly, the display device 10 can be suitably used as a flat panel display such as a wall-mounted television set and a plane luminant and is applicable to light sources of copiers, printers, etc., light sources of liquid crystal displays, meters, etc., display boards, marker lamps and the like.

In the foregoing example, the embodiments are applied to a display apparatus of an active matrix type have been described. However, the display apparatus according to an embodiment is also applicable to a display apparatus of a passive matrix type, and the same effects can be obtained.

In each of the organic electroluminescent devices 11R (11), 11G and 11B, the layers other than the light-emitting layer 14c may be made common. Also, in the green light-emitting 11G and the blue light-emitting device 11B, the electron transport layer 14d constituted of a different material may be provided so as to make it suitable for the light-emitting layers 14c-G and 14c-B, respectively.

Figure 4:
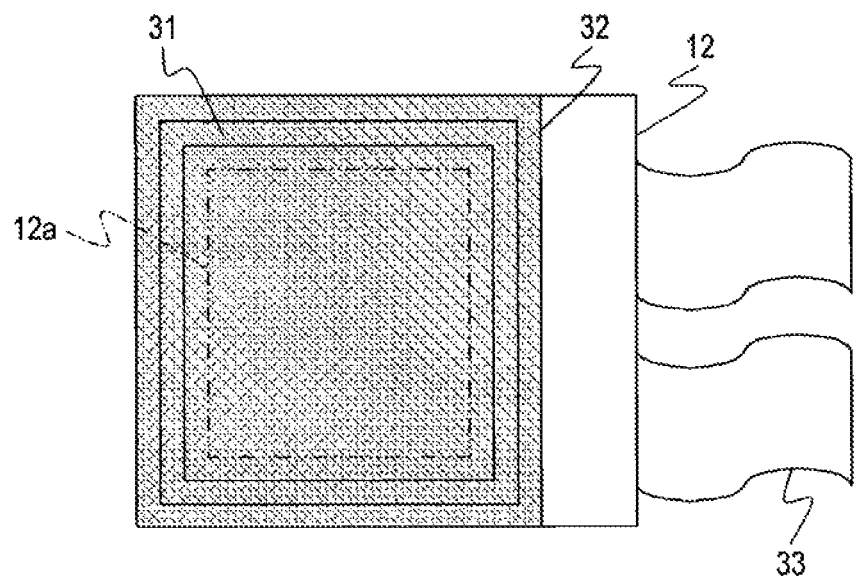
FIG. 4 is a configuration view showing a display apparatus of a module shape of a sealed configuration to which an embodiment is applied.

The display apparatus according to an embodiment as described above also includes one of a module shape having a sealed configuration as illustrated in FIG. 4. For example, a display module formed by providing a sealing portion 31 so as to surround the display region 12a which is a pixel array portion and sticking to an opposing portion (seal substrate 32) such as a transparent glass while using this sealing portion 31 as an adhesive is corresponding thereto. In this transparent seal substrate 32, a color filter, a passivation film, a light-shielding film and the like may be provided. In the substrate 12 as the display module having the display region 12a formed therein, a flexible print substrate 33 for inputting or outputting signals or the like to the display region 12a (pixel array portion) from the outside may be provided.

<<Application Examples>>

The display apparatus according to an embodiment as described above is applicable to display apparatus of electronic appliances in all of fields where a picture image signal inputted in an electronic appliance or a picture image signal generated in an electronic appliance as an image or a picture image, for example, various electronic appliances as illustrated in FIGS. 5 to 9, for example, a digital camera, a notebook type personal computer, a portable terminal unit such as a portable handset and a video camera. Examples of electronic appliances to which an embodiment is applied are hereunder described.

Figure 5:
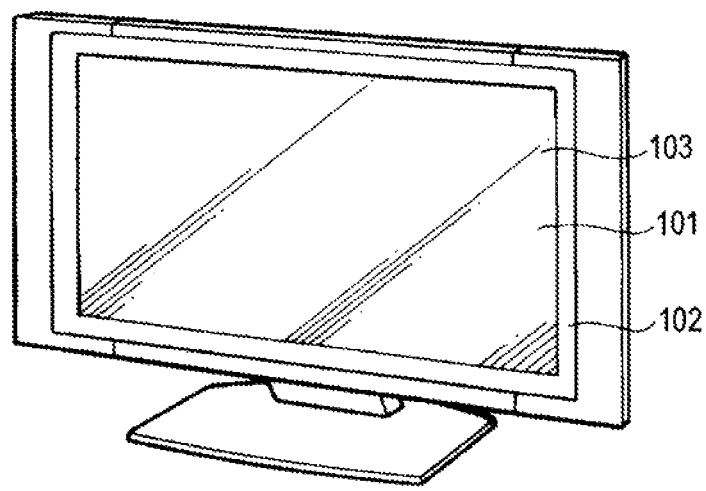
FIG. 5 is a perspective view showing a television receiver to which an embodiment is applied.

FIG. 5 is a perspective view showing a television receiver to which an embodiment is applied. The television receiver according to the present application example includes a picture image display screen portion 101 which is configured of a front panel 102, a filter glass 103 and the like and is prepared by using the display apparatus according to an embodiment as the picture image display screen portion 101.

Figure 6A:
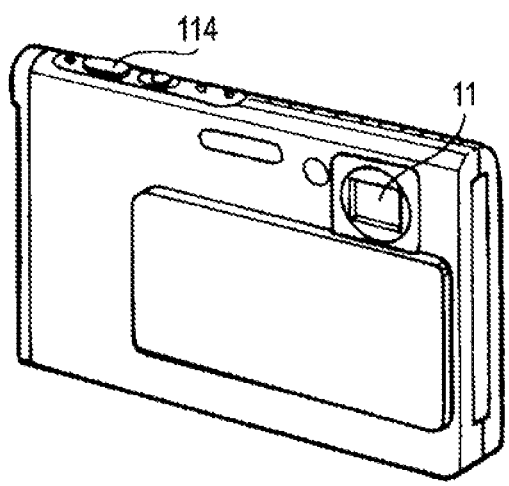
Figure 6B:
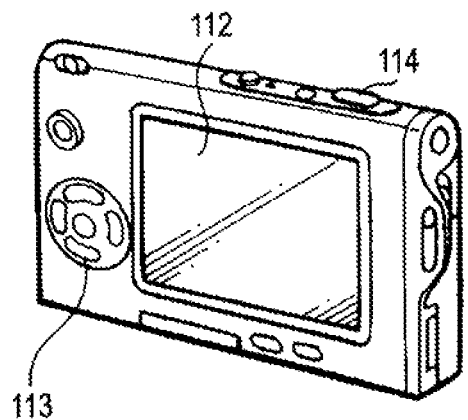

FIGS. 6A and 6B are views showing a digital camera to which an embodiment is applied, in which FIG. 6A is a perspective view seen from the front side; and FIG. 6B is a perspective view seen from the rear side. The digital camera according to the present application example includes a light emission portion 111 for flash, a display portion 112, a menu switch 113, a shutter button 114 and the like and is prepared by using the display apparatus according to an embodiment as the display portion 112.

Figure 7:
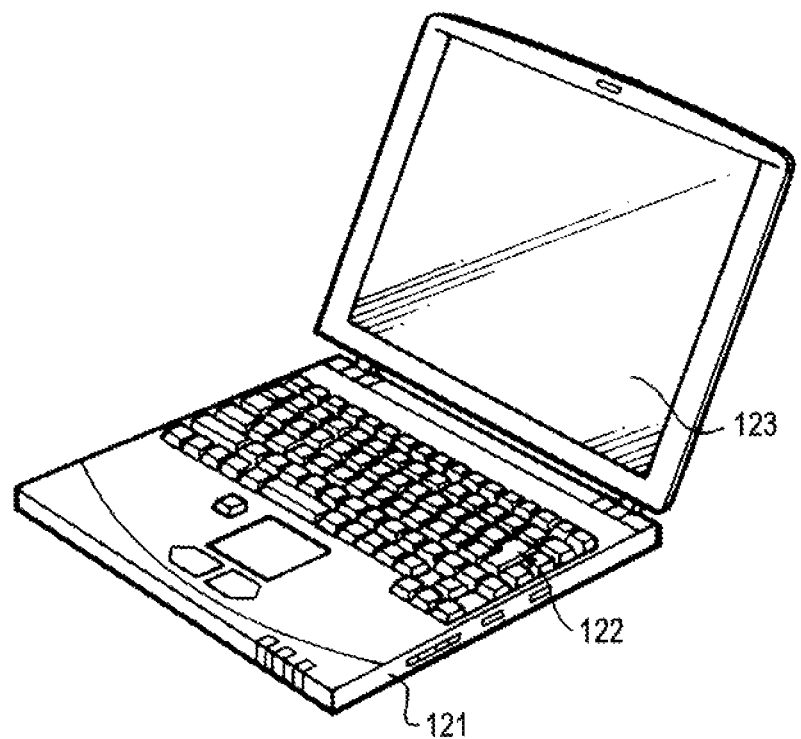
FIG. 7 is a perspective view showing a notebook type personal computer to which an embodiment is applied.

FIG. 7 is a perspective view showing a notebook type personal computer to which an embodiment is applied. The notebook type personal computer according to the present application example includes a main body 121, a keyboard 122 to be operated when letters or the like are inputted, a display portion 123 for displaying an image and the like and is prepared by using the display apparatus according to an embodiment as the display portion 123.

Figure 8:
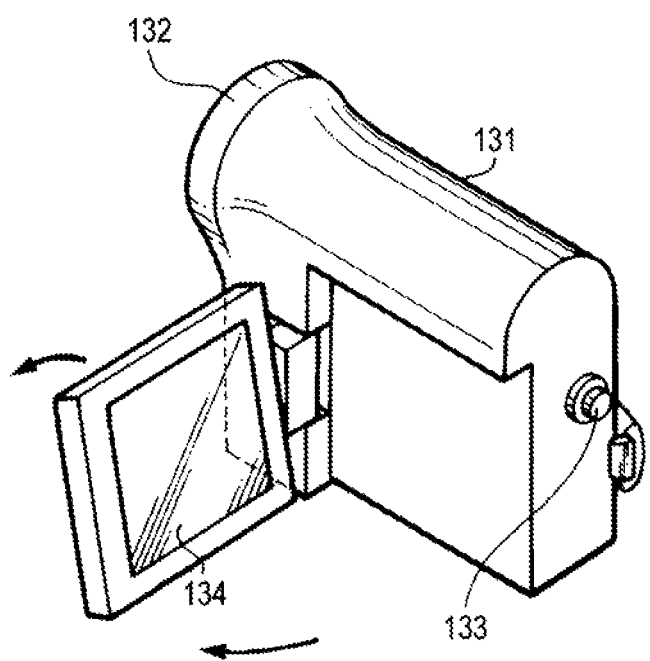
FIG. 8 is a perspective view showing a video camera to which an embodiment is applied.

FIG. 8 is a perspective view showing a video camera to which an embodiment is applied. The video camera according to the present application example includes a main body portion 131, a lens 132 for shooting a scene of a subject as positioned at a forward side face, a start/stop switch 133 at the shooting, a display portion 134 and the like and is prepared by using the display apparatus according to an embodiment as the display portion 134.

FIGS. 9A to 9G are views showing a portable terminal unit, for example, a portable handset, to which an embodiment is applied, wherein FIG. 9A is a front view in an opened state; FIG. 9B is a side view thereof; FIG. 9C is a front view in a closed state; FIG. 9D is a left side view; FIG. 9E is a right side view; FIG. 9F is a top view; and FIG. 9G is a bottom view. The portable handset according to the present application example includes an upper casing 141, a lower casing 142, a connection portion (here, a hinge portion) 143, a display 144, a sub-display 145, a picture light 146, a camera 147 and the like and is prepared by using the display apparatus according to an embodiment as the display portion 144 or the sub-display 145.

EXAMPLES

Specific manufacturing procedures of organic electroluminescent devices of the Examples according to an embodiment and Comparative Examples are hereunder described by referring to FIG. 1, and evaluation results thereof are then described.

Examples 1 to 7 and Comparative Examples 1 to 8

First of all, a cell for organic electroluminescent device for top emission in which an ITO transparent electrode having a thickness of 12.5 nm was stacked on a 190 nm-thick Ag alloy (reflecting layer) as the anode 13 was prepared on the substrate 12 composed of a glass sheet (30 mm×30 mm).

Next, a film composed of m-MTDATA represented by the following structural formula (101) was formed in a thickness of 12 nm as the hole injection layer 14a of the organic layer 14 by a vacuum vapor deposition method (vapor deposition rate: 0.2 to 0.4 nm/sec). The term "m-MTDATA" as referred to herein means 4,4′,4″-tris(phenyl-m-tolylamino)triphenylamine.

Structural Formula (101)

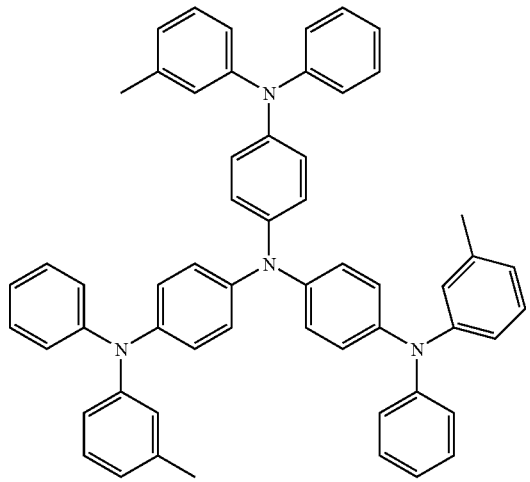

Next, a film composed of α-NPD represented by the following structural formula (102) was formed in a thickness of 12 nm as the hole transport layer 14b (vapor deposition rate: 0.2 to 0.4 nm/sec). The term "α-NPD" as referred to herein means N,N′-bis(1-naphthyl)-N,N′-diphenyl[1,1′-biphenyl]-4,4′-diamine.

Structural Formula (102)

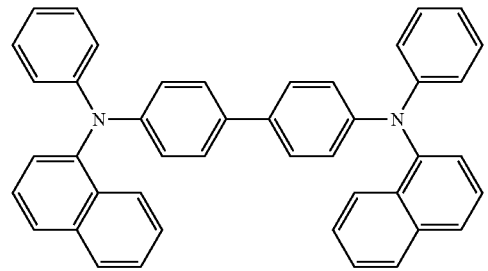

Thereafter, the light-emitting layer 14c and the electron transport layer 14d were successively formed by means of vapor deposition by using materials chosen for every of the respective Examples 1 to 7 and Comparative Examples 1 to 8 as shown in the following Table 2. As to the light-emitting layer 14c, the thickness was 30 nm, and a dope concentration of the gust material was 1%. The thickness of the electron transport layer 14d was 35 nm.

TABLE 2

| | Light-emitting layer 14c | | | Drive voltage | Current efficiency | Color coordinate | Life |
|---|---|---|---|---|---|---|---|
| | Host material | Guest material | Electron transport layer 14d | (V) | (cd/A) | (x, y) | (hr) |
| Example 1 | Rubrene: Structural formula (103) | Structural formula (105) | Compound (1)-7 | 5.5 | 15 | (0.64, 0.34) | 1,000 or more |
| Example 2 | | | Compound (1)-6 | 5.2 | 15.3 | (0.64, 0.34) | 1,000 or more |
| Example 3 | | | Compound (1)-12 | 5.3 | 16 | (0.64, 0.34) | 1,000 or more |
| (Comparative Example 1) | | | Structural formula (110) | 7.3 | 6 | (0.54, 0.43) | 100 |
| (Comparative Example 2) | | | BCP | 6.3 | 5 | (0.60, 0.40) | 10 |
| (Comparative Example 3) | | | BCP 10/Structural formula (110) 30 | 9.2 | 8 | (0.62, 0.37) | 3 |
| (Comparative Example 4) | ADN: Structural formula (104) | | Compound (1)-1 | 5.3 | 0.3 | (0.64, 0.34) | 0.3 |
| Example 4 | Rubrene: Structural formula (103) | Structural formula (106) | Compound (1)-12 | 5.8 | 8.3 | (0.60, 0.35) | 1,000 or more |
| (Comparative Example 5) | | | Structural formula (110) | 9.2 | 3.6 | (0.54, 0.43) | 120 |
| Example 5 | | Structural | Compound (1)-12 | 5.4 | 13.6 | (0.67, 0.33) | 1,000 or more |

TABLE 2-continued

| | Light-emitting layer 14c | | Drive voltage | Current efficiency | Color coordinate | Life |
|---|---|---|---|---|---|---|
| | Host material | Guest material | Electron transport layer 14d | (V) | (cd/A) | (x, y) | (hr) |
| (Comparative Example 6) | | formula (107) | Structural formula (110) | 9.3 | 4.3 | (0.54, 0.44) | 105 |
| Example 6 | | Structural formula (108) | Compound (1)-12 | 5.6 | 10 | (0.61, 0.36) | 1,000 or more |
| (Comparative Example 7) | | | | 9.1 | 4.2 | (0.54, 0.43) | 55 |
| Example 7 | | Structural formula (109) | Compound (1)-12 | 5.4 | 6.4 | (0.65, 0.33) | 1,000 or more |
| (Comparative Example 8) | | | Structural formula (110) | 9.6 | 2 | (0.52, 0.43) | 30 |

As the host material of the light-emitting layer 14c among the respective materials as shown in Table 2, rubrene represented by the following structural formula (103) was used, and ADN represented by the following structural formula (104) was used only in Comparative Example 4.

Structural Formula (103)

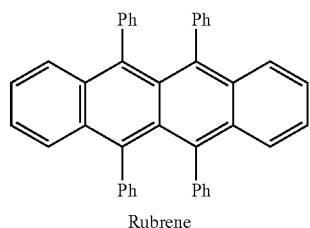

Rubrene

Structural Formual (104)

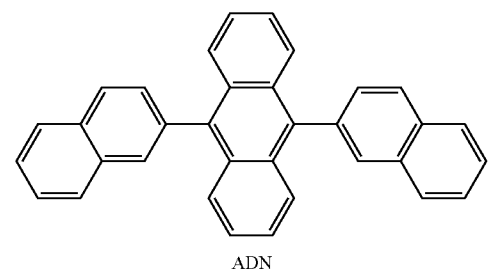

ADN

Also, as the guest material of the light-emitting layer 14c, the perylene derivative represented by the following structural formula (105), the diketopyrrolopyrrole derivative represented by the following structural formula (106), the pyromethene derivative represented by the following structural formula (107), the pyran derivative represented by the following structural formula (108) or the styryl derivative represented by the following structural formula (109) was used.

Structural Formula (105)

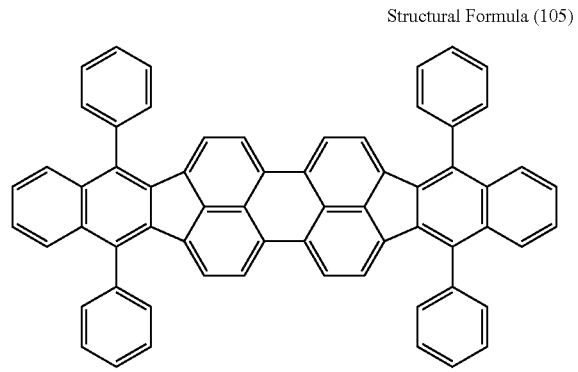

Structural Formula (106)

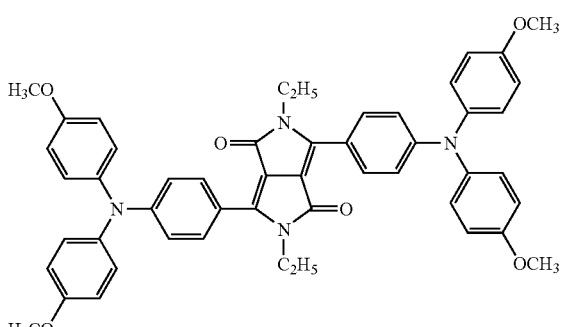

Structural Formula (107)

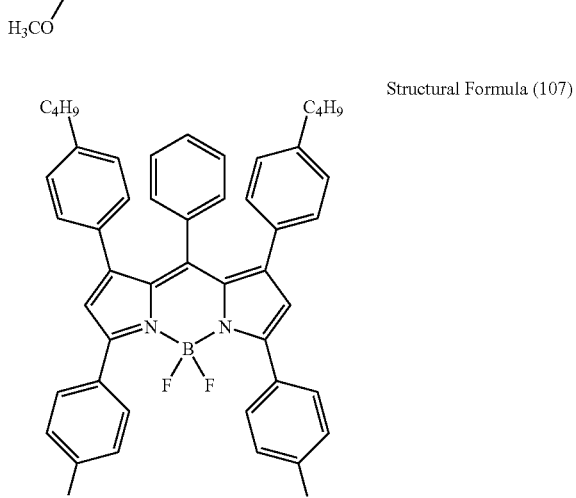

Structural Formula (108)

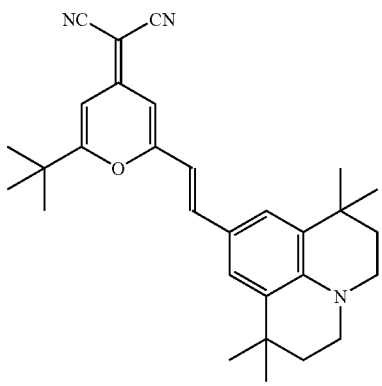

-continued

Structural Formula (109)

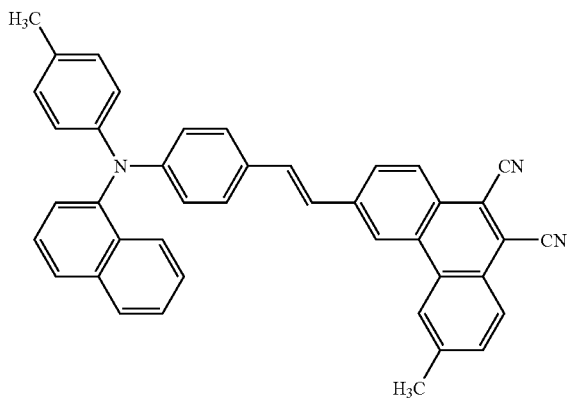

In the electron transport layer 14d, Compound (1)-1, Compound (1)-6, Compound (1)-7 or Compound (1)-12, each of which is the benzimidazole derivative as a characteristic compound in an embodiment as shown in Table 1-1 or 1-2, Alq3 represented by the following structural formula (110), or BCP was used. In Comparative Example 3, BCP (bathocuproine) and Alq3 represented by the structural formula (110) was used in a volume ratio of 10/30.

Structural Formula (110)

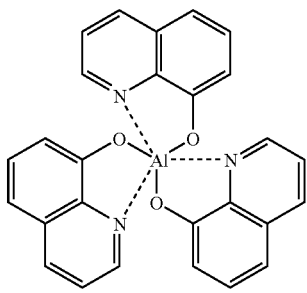

There was thus formed the organic layer 14 composed of a stack of the hole injection layer 14a, the hole transport layer 14b, the light-emitting layer 14c and the electron transport layer 14d in this order. Thereafter, a film composed of LiF was formed in a thickness of about 0.3 nm as the first layer 15a of the cathode 15 by a vacuum vapor deposition method (vapor deposition rate: 0.01 nm/sec). Finally, a 10 nm-thick MaAg film was formed as the second layer 15b of the cathode 15 on the first layer 15a by a vacuum vapor deposition method.

<Evaluation Results>

Each of the organic electroluminescent devices as prepared in the foregoing Examples 1 to 7 and Comparative Examples 1 to 8 was measured with respect to the drive voltage (V) at the drive at a current density of 10 mA/cm², the current efficiency (cd/A) and the color coordinate (x, y). When an initial brightness in performing constant-current driving under a load of 1.00 mA/cm² at 50° C. and a duty of 25% was defined as 1, a time until the brightness was changed to 0.9 was measured as a life (hour). The obtained results are also shown in the foregoing Table 2.

As shown in Table 2, it was confirmed that in all of the organic electroluminescent devices of Examples 1 to 7 to which an embodiment is applied and in which rubrene is used as the host material of the light-emitting layer 14c, and the electron transport layer 14d composed of a benzimidazole derivative is provided, the drive voltage is controlled on a low level, the current efficiency is high above two times, and the long life characteristic is enhanced about 10 times or more as compared with the organic electroluminescent devices of the Comparative Examples to which an embodiment is not applied.

Also, it was confirmed that as to Examples 1 to 7, red emission with high color purity which is emission from the light-emitting guest material is obtainable.

On the other hand, as to the organic electroluminescent devices of Comparative Examples 1 to 3 and 5 to 8, because of a shortage of electron supply to the light-emitting layer, the drive voltage increased, and the electron emission region spread into the electron transport layer, thereby generating deterioration of a light-emitting color and shortening the life. Also, as to the organic electroluminescent device of Comparative Example 4, the energy transfer from the host material to the light-emitting guest material was hardly generated, whereby sufficient luminous efficiency was not obtainable.

Also, what in all of the organic electroluminescent devices of the Examples, high-purity red emission is obtained demonstrates that it is possible to realize full-color display with high color reproducibility by configuring a pixel through a set of a green light-emitting device and a blue light-emitting device together with such an organic electroluminescent device.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention claimed is:

1. A red light-emitting organic electroluminescent device comprising:
   an anode;
   a cathode;
   an organic layer which includes a light-emitting layer and is interposed between the anode and cathode, the light-emitting layer including a red light-emitting guest material and a host material composed of a polycyclic aromatic hydrocarbon compound with a mother skeleton having a ring member number of from four to seven; and
   an electron transport layer including a benzimidazole derivative represented by the following general formula (1) provided adjacent to the light-emitting layer General Formula (1)

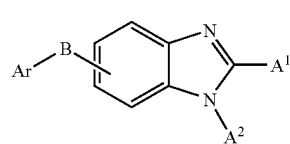

wherein
$A^1$ represents a hydrogen atom, a substituted or unsubstituted aryl group having not more than sixty carbon atoms, a substituted or unsubstituted heterocyclic group, a substituted or unsubstituted alkyl group having from one to twenty carbon atoms or an alkoxy group having from one to twenty carbon atoms;
$A^2$ represents a hydrogen atom, an unsubstituted aryl group having not more than sixty carbon atoms, an unsubstituted heterocyclic group, an unsubstituted alkyl group having from one to twenty carbon atoms or an alkoxy group having from one to twenty carbon atoms;
B represents a substituted or unsubstituted arylene group having not more than sixty carbon atoms, a pyridinylene group which may have a substituted or unsubstituted group, a quinolinylene group which may have a substituent or a fluorenylene group which may have a substituent; and Ar represents a substituted or unsubstituted alkyl group having from one to twenty carbon atoms or a substituted or unsubstituted alkoxy group having from one to twenty carbon atoms.

2. The organic electroluminescent device according to claim 1, wherein the mother skeleton of the polycyclic aromatic hydrocarbon compound which configures the host material of the light-emitting layer is selected from the group consisting of pyrene, benzopyrene, chrysene, naphthacene, benzonaphthacene, dibenzonaphthacene, perylene and coronene.

3. The organic electroluminescent device according to claim 1, wherein a compound represented by the following general formula (2) is used as the host material of the light-emitting layer:

General Formula (2)

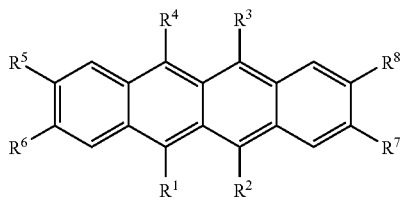

wherein $R^1$ to $R^8$ each independently represents hydrogen, a halogen, a hydroxyl group, a substituted or unsubstituted carbonyl group having not more than twenty carbon atoms, a substituted or unsubstituted carbonyl ester group having not more than twenty carbon atoms, a substituted or unsubstituted alkyl group having not more than twenty carbon atoms, a substituted or unsubstituted alkenyl group having not more than twenty carbon atoms, a substituted or unsubstituted alkoxyl group having not more than twenty carbon atoms, a cyano group, a nitro group, a substituted or unsubstituted silyl group having not more than thirty carbon atoms, a substituted or unsubstituted aryl group having not more than thirty carbon atoms, a substituted or unsubstituted heterocyclic group having not more than thirty carbon atoms or a substituted or unsubstituted amino group having not more than thirty carbon atoms.

4. The organic electroluminescent device according to claim 1, wherein the electron transport layer has a stack structure including a plurality of layers.

5. The organic electroluminescent device according to claim 1, wherein the electron transport layer has a layer formed by subjecting plural kinds of the benzimidazole derivative to simultaneous vapor deposition.

6. A display apparatus comprising:
a substrate; and
a plural number of red light-emitting organic electroluminescent devices provided on the substrate and including
an anode,
a cathode,
an organic layer which includes a light-emitting layer and is interposed between the anode and cathode, the light-emitting layer including a red light-emitting guest material and a host material composed of a polycyclic aromatic hydrocarbon compound whose mother skeleton has a ring member number of from four to seven; and an electron transport layer containing a benzimidazole derivative represented by the following general formula (1) provided adjacent to the light-emitting layer General Formula (1)

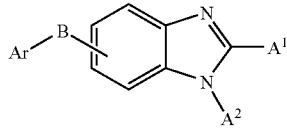

wherein $A^1$ represents a hydrogen atom, a substituted or unsubstituted aryl group having not more than sixty carbon atoms, a substituted or unsubstituted heterocyclic group, a substituted or unsubstituted alkyl group having from one to twenty carbon atoms or an alkoxy group having from one to twenty carbon atoms;

$A^2$ represents a hydrogen atom, an unsubstituted aryl group having not more than sixty carbon atoms, an unsubstituted heterocyclic group, an unsubstituted alkyl group having from one to twenty carbon atoms or an alkoxy group having from one to twenty carbon atoms;

B represents a substituted or unsubstituted arylene group having not more than sixty carbon atoms, a pyridinylene group which may have a substituted or unsubstituted group, a quinolinylene group which may have a substituent or a fluorenylene group which may have a substituent; and Ar represents a substituted or unsubstituted alkyl group having from one to twenty carbon atoms or a substituted or unsubstituted alkoxy group having from one to twenty carbon atoms.

7. The display apparatus according to claim 6, wherein the organic electroluminescent device is provided as a red light-emitting device in a part of plural pixels.

8. The display apparatus according to claim 6, wherein a blue light-emitting, organic electroluminescent device and a green light-emitting, organic electroluminescent device are provided together with the red light-emitting device on the substrate.

9. The organic electroluminescent device according to claim 1, wherein the guest material is represented by the following formula (106)

Structural Formula (106)

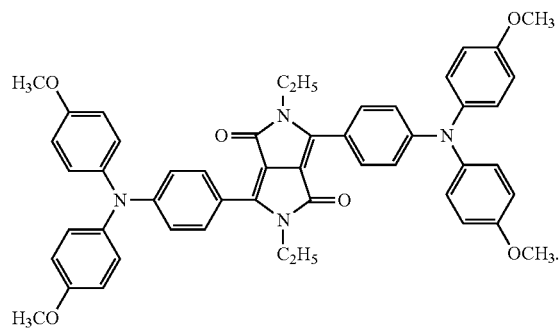

10. The organic electroluminescent device according to claim 1, wherein the guest material is represented by the following formula (107)

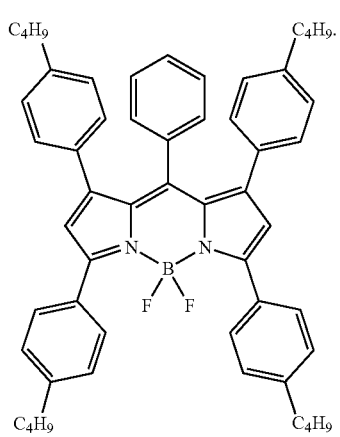

Structural Formula (107)

11. The organic electroluminescent device according to claim 1, wherein the guest material is represented by the following formula (108)

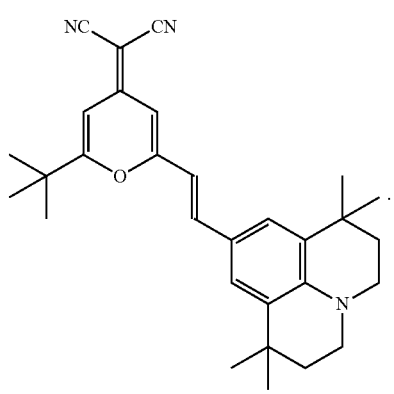

Structural Formula (108)

12. The organic electroluminescent device according to claim 1, wherein the guest material is represented by the following formula (109)

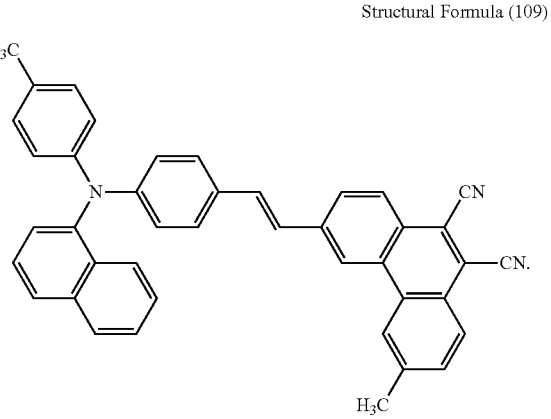

Structural Formula (109)

13. The organic electroluminescent device according to claim 1, wherein the host material is represented by the following formula (103)

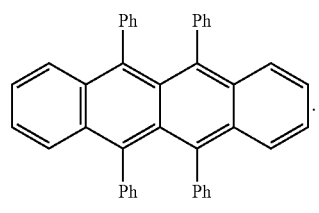

Structural Formula (103)

Rubrene

* * * * *